United States Patent
Yoon et al.

(10) Patent No.: US 8,293,604 B2
(45) Date of Patent: Oct. 23, 2012

(54) METHODS OF MANUFACTURING VERTICAL CHANNEL SEMICONDUCTOR DEVICES

(75) Inventors: Jae-man Yoon, Seoul (KR); Dong-gun Park, Gyeonggi-do (KR); Choong-Ho Lee, Gyeonggi-do (KR); Seong-Goo Kim, Seoul (KR); Won-sok Lee, Gyeonggi-do (KR); Seung-bae Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 282 days.

(21) Appl. No.: 12/838,826

(22) Filed: Jul. 19, 2010

(65) Prior Publication Data
US 2010/0285645 A1 Nov. 11, 2010

Related U.S. Application Data

(60) Division of application No. 12/022,329, filed on Jan. 30, 2008, now Pat. No. 7,781,287, which is a continuation of application No. 11/448,437, filed on Jun. 7, 2006, now Pat. No. 7,348,628.

(30) Foreign Application Priority Data

Jul. 15, 2005 (KR) .................................. 2005-64182

(51) Int. Cl.
*H01L 21/336* (2006.01)
(52) U.S. Cl. ......... 438/272; 438/212; 438/268; 438/270
(58) Field of Classification Search .................. 438/212, 438/268, 270, 272
See application file for complete search history.

(56) References Cited

U.S. PATENT DOCUMENTS

| | | | |
|---|---|---|---|
| 4,670,768 A | 6/1987 | Sunami et al. | 257/331 |
| 5,350,934 A | 9/1994 | Matsuda | 257/139 |
| 5,399,516 A | 3/1995 | Bergendahl et al. | 438/589 |
| 5,466,961 A | 11/1995 | Kikuchi et al. | 257/379 |
| 5,468,663 A | 11/1995 | Bertin et al. | 438/259 |
| 5,480,838 A | 1/1996 | Mitsui | 438/270 |
| 5,508,544 A | 4/1996 | Shah | 257/316 |
| 5,656,842 A | 8/1997 | Iwamatsu et al. | 257/329 |
| 5,885,864 A | 3/1999 | Ma | 438/253 |

(Continued)

FOREIGN PATENT DOCUMENTS
KR 100223807 7/1999

OTHER PUBLICATIONS

First Chinese Office Action (5 pages) corresponding to Chinese Patent Application No. 200610105583X; Issue Date: Apr. 24, 2009.

*Primary Examiner* — Bac Au
(74) *Attorney, Agent, or Firm* — Myers Bigel Sibley & Sajovec

(57) ABSTRACT

Vertical channel semiconductor devices include a semiconductor substrate with a pillar having an upper surface. An insulated gate electrode is around a periphery of the pillar. The insulated gate electrode has an upper surface at a vertical level lower than the upper surface of the pillar to vertically space apart the insulated gate electrode from the upper surface of the pillar. A first source/drain region is in the substrate adjacent the pillar. A second source/drain region is disposed in an upper region of the pillar including the upper surface of the pillar. A contact pad contacts the entire upper surface of the pillar to electrically connect to the second source/drain region.

13 Claims, 25 Drawing Sheets

U.S. PATENT DOCUMENTS

| | | | |
|---|---|---|---|
| 6,114,725 A | 9/2000 | Furukawa et al. | 257/330 |
| 6,476,444 B1 | 11/2002 | Min | 257/330 |
| 6,477,080 B2 | 11/2002 | Noble | 365/154 |
| 6,661,036 B1 | 12/2003 | Sittig et al. | 257/124 |
| 6,756,625 B2 | 6/2004 | Brown | 257/300 |
| 6,891,225 B2 | 5/2005 | Horiguchi et al. | 257/331 |
| 6,949,432 B2 | 9/2005 | Blanchard | 438/259 |
| 6,960,508 B2 | 11/2005 | Koh | 438/270 |
| 7,157,771 B2 | 1/2007 | Forbes | 257/330 |
| 7,205,604 B2 | 4/2007 | Ouyang et al. | 257/328 |
| 7,241,655 B2 * | 7/2007 | Tang et al. | 438/212 |
| 7,242,057 B2 * | 7/2007 | Tang et al. | 257/330 |
| 2002/0175365 A1 | 11/2002 | Hirayama | 257/329 |
| 2003/0001203 A1 | 1/2003 | Ono et al. | 257/330 |
| 2003/0186506 A1 | 10/2003 | Huang | 438/264 |
| 2004/0262676 A1 | 12/2004 | Lee et al. | 257/328 |
| 2006/0046392 A1 | 3/2006 | Manning et al. | 438/268 |
| 2006/0097304 A1 | 5/2006 | Yoon et al. | 257/307 |

\* cited by examiner

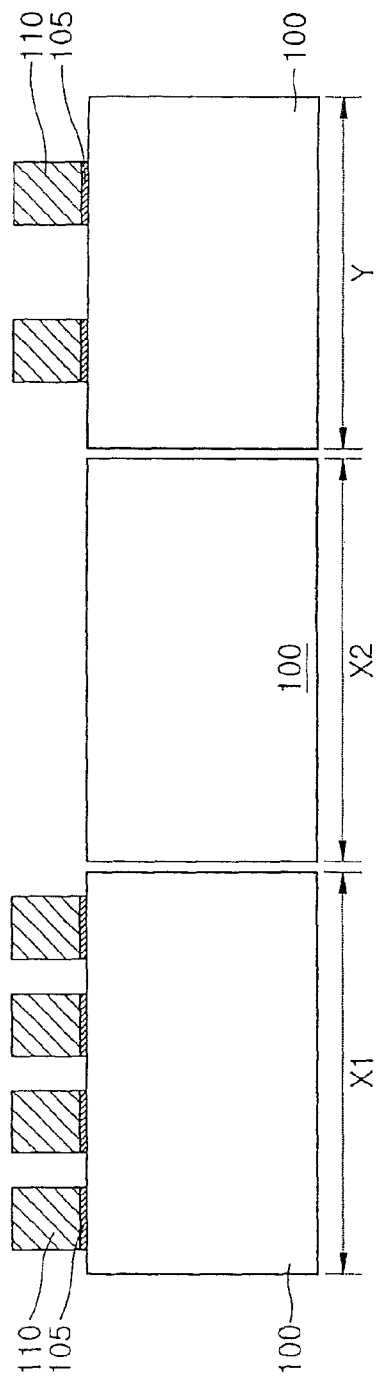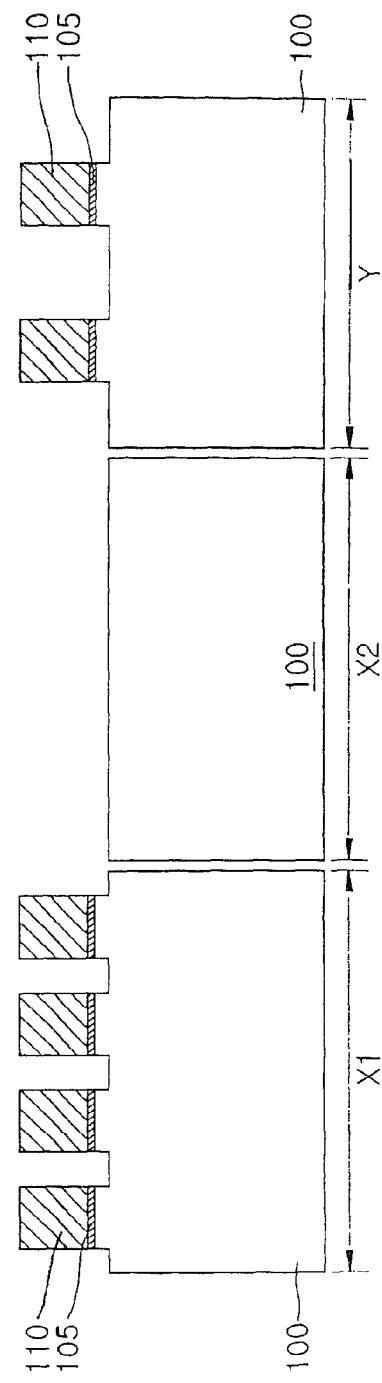

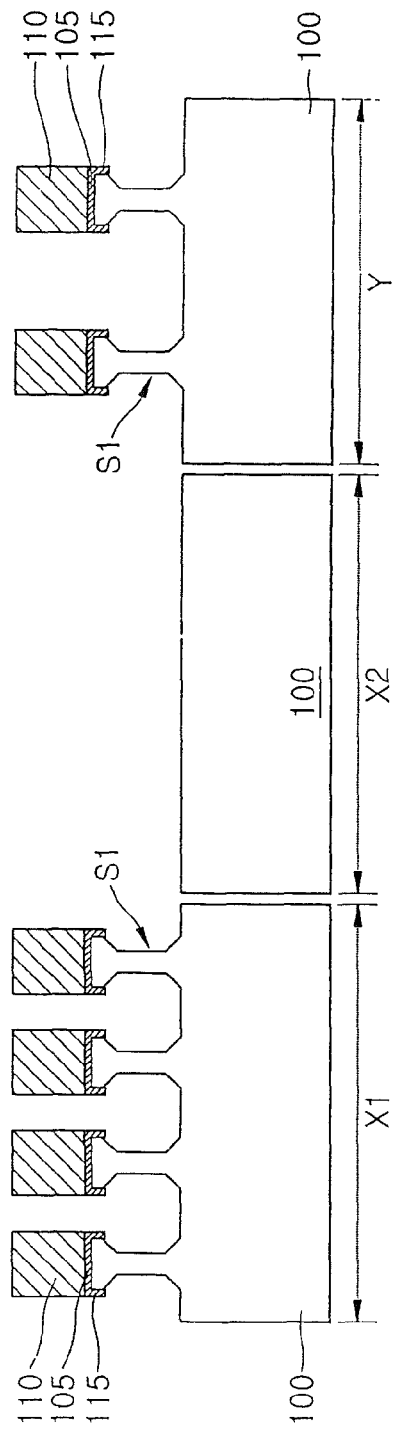
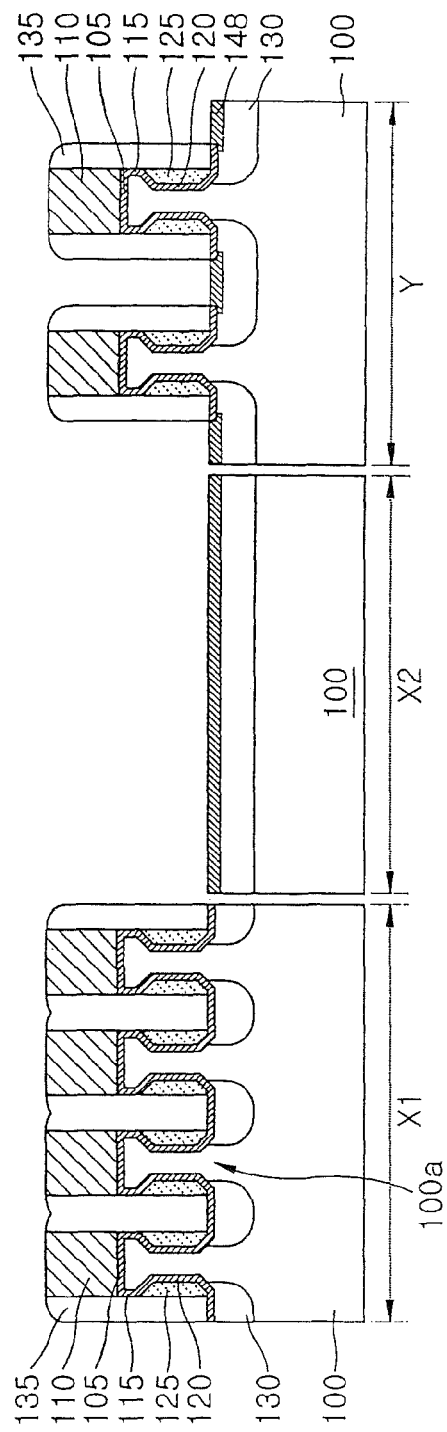

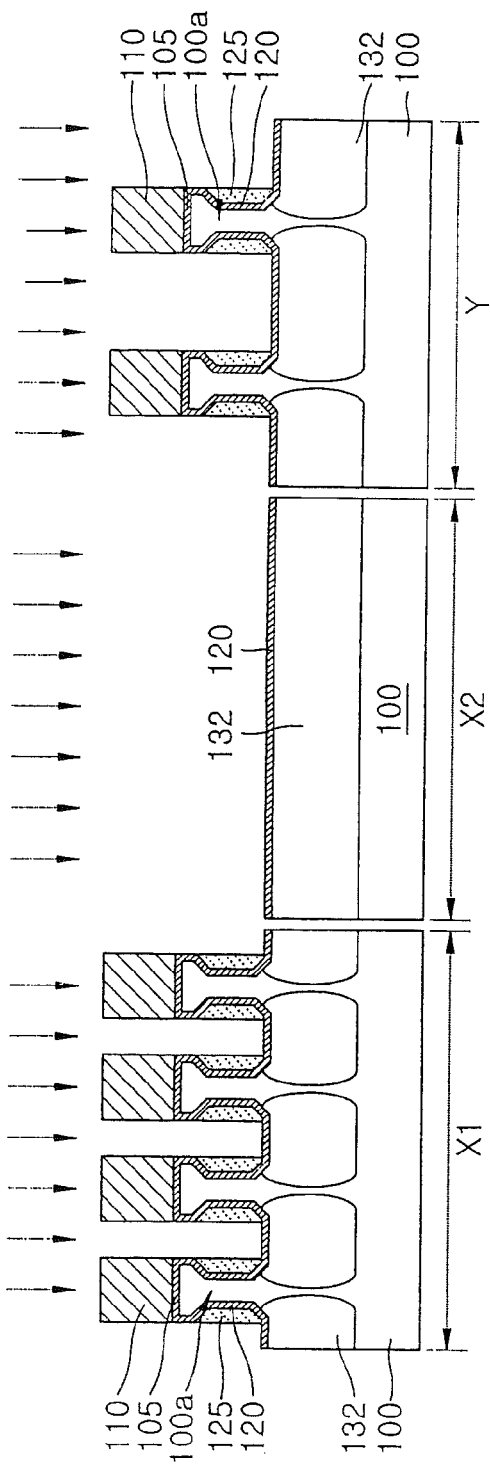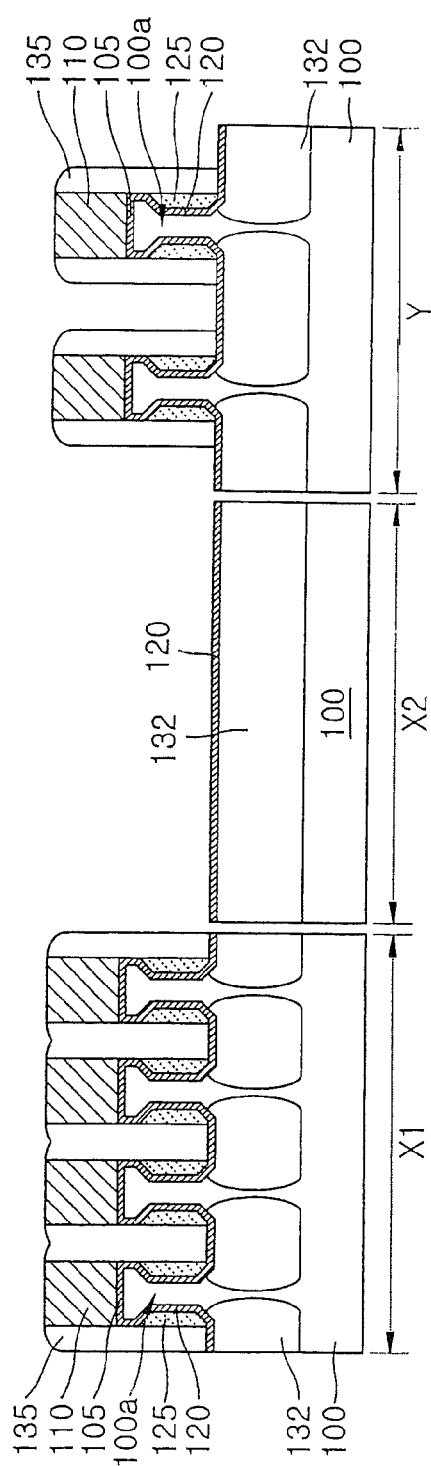

METHODS OF MANUFACTURING VERTICAL CHANNEL SEMICONDUCTOR DEVICES

CROSS-REFERENCE TO RELATED APPLICATION

This application is a divisional application of U.S. application Ser. No. 12/022,329 filed Jan. 30, 2008 now U.S. Pat. No. 7,781,287 which is continuation application of U.S. application Ser. No. 11/448,437, which was filed Jun. 7, 2006 and issued as U.S. Pat. No. 7,348,628 on Mar. 25, 2008, and claims priority to Korean Patent Application No. 10-2005-0064182, filed on Jul. 15, 2005, in the Korean Intellectual Property Office, the disclosure of which is incorporated herein by reference in its entirety.

BACKGROUND OF THE INVENTION

The present invention relates to semiconductor devices and methods of manufacturing the same, and more particularly, to vertical channel semiconductor devices and methods of manufacturing the same.

As the integration density of semiconductor devices increases, the size of features, such as metal oxide semiconductor (MOS) transistors (i.e., the channel length of a MOS transistor) decreases so that more devices may be integrated on a substrate in a given area. However, when the channel length of the MOS transistor decreases, short channel effects (e.g., a drain induced barred barrier lowering (DIBL) effect, a hot carrier effect and/or a punch trough effect) may also be caused, which may affect performance of the high integration density semiconductor device. Various methods have been proposed to address short channel effects. One method is to reduce the depth of a junction region and another method is to form a groove in a channel region to relatively extend the channel length.

However, in the case of a semiconductor memory device, such as a dynamic random access memory (DRAM), a MOS transistor with a channel length of below an exposure limit is generally required as the integration density approaches a gigabit level. Therefore, a planar type MOS transistor, in which a source and a drain are formed on substantially the same plane, is difficult to implement in a gigabit memory device.

Vertical channel semiconductor devices have been proposed in which a source and a drain are vertically arranged to form a vertical channel. FIG. 1 is a cross-sectional view of a conventional vertical channel semiconductor device. As shown in FIG. 1, the vertical channel semiconductor device includes pillars 15 that may be defined in a semiconductor substrate 10 by a hard mask pattern. A gate electrode 25 is shown formed on the surface of the pillar 15 that surrounds the periphery of the pillar 15. A gate insulation layer 20 is interposed between the gate electrode 25 and the pillar 15. A drain region 30a is formed in the substrate 10 between the pillars 15, and a source region 30b is formed on the upper surface of the pillar 15 between (surrounded by) the gate electrodes 25. A bit line 35 is selectively formed on the surface of the drain region 30a. An interlayer insulating layer 40 is formed between the pillars 15 so as to insulate the pillars 15 from each other, and a contact pad 45 is formed to contact with the source region 30b. An insulating layer 50 is formed between the source contact pad 45 and the interlayer insulating layer 40 so as to insulate the source contact pad 45 and the interlayer insulating layer 40 from each other.

A channel between the source region 30b and the drain region 30b is formed with a substantially vertical type architecture as the source region 30b is formed in the upper region of the pillar 115 and the drain region 30a is formed in the lower region of the pillar 15. Therefore, the channel length may not be affected by a decrease in the planar surface area of the MOS transistor.

Thus, while the planar area required for a MOS transistor may be decreased with a vertical architecture, the channel length may not be affected as the planar area of the vertical channel semiconductor device, including the areas of the pillar 15 and the source region 30b, decrease. However, the area of the contact pad 45 contacting with the source region 30b decreases, which may increase the contact resistance. As the insulating spacer 50 is formed over the pillar 15 to insulate the contact pad 45 from the gate electrode 25, the area of the contact pad 45 further decreases due to the area occupied by the insulating spacer 50, which may even further increase the contact resistance to the source region 30b. This structure may also increase the contact resistance of a storage electrode that will contact with the contact pad 45.

Moreover, the bit line 35 is typically formed by exposing a predetermined portion of the drain region 30a and selectively forming a conductive layer in the exposed drain region 30a. As such, the exposed drain region 30a is also narrowed with increasingly high integration density of the semiconductor device and the contact area between the drain region 30a and the bit line 35 is also narrowed, which may make it difficult to obtain a low contact resistance between the drain region 30a and the bit line 35.

SUMMARY OF THE INVENTION

Some embodiments of the present invention provide vertical channel semiconductor devices. A semiconductor substrate includes a pillar having an upper surface. An insulated gate electrode is around a periphery of the pillar. The insulated gate electrode has an upper surface at a vertical level lower than the upper surface of the pillar to vertically space apart the insulated gate electrode from the upper surface of the pillar. A first source/drain region is in the substrate adjacent the pillar. A second source/drain region is disposed in an upper region of the pillar including the upper surface of the pillar. A contact pad contacts the entire upper surface of the pillar to electrically connect to the second source/drain region.

In other embodiments, the pillar includes an isotropic space disposed at a position vertically spaced apart from the upper surface of the pillar by a predetermined distance to define the vertical level of the upper surface of the gate electrode. The gate electrode fills the isotropic space. The device further includes a gate insulating layer interposed between the pillar and the gate electrode. The gate insulating layer may extend vertically along a sidewall of the pillar between the upper surface of the pillar and the isotropic space. The gate insulating layer may be a silicon oxide ($SiO_2$) layer, a hafnium oxide ($HfO_2$) layer, a tantalum oxide ($Ta_2O_5$) layer, an oxide/nitride (ON) layer and/or an oxide/nitride/oxide (ONO) layer.

In further embodiments, a gate signal line contacts the gate electrode. A first source/drain signal line contacts the first source/drain region and extends in a direction perpendicular to the gate signal line. The first source/drain signal line may be insulated from the gate electrode and surround a periphery of the gate electrode. The first source/drain region may include an isotropic space vertically spaced apart from an upper surface of the source/drain region and the first source/ drain signal line may be in the isotropic space. An insulating layer may cover a sidewall of the first source/drain region extending between the upper surface of the first source/drain region and the first source/drain signal line.

In other embodiments, the first source/drain region and the second source/drain region are electrically insulated from each other by the gate electrode and a gate insulating layer. An insulating spacer may be provided around the periphery of the pillar and the insulated gate electrode. A storage electrode may be disposed on the contact pad.

In yet further embodiments, vertical channel semiconductor devices include a semiconductor substrate including a pillar. An insulated gate electrode is around a periphery of the pillar. A first source/drain region is around the periphery of the pillar below the gate electrode. The first source/drain region includes an isotropic space under the gate electrode and vertically spaced from an upper surface of the first source/drain region. A second source/drain region is in an upper region of the pillar. A first source/drain signal line is under the gate electrode in the isotropic space of the first source/drain region and contacts the first source/drain region. An insulating layer may cover a sidewall of the first source/drain region extending between the upper surface of the first source/drain region and the first source/drain signal line.

In other embodiments, the pillar includes an isotropic space disposed at a position vertically spaced apart from the upper surface of the pillar by a predetermined distance and the gate electrode fills the isotropic space. The device further includes a gate insulating layer interposed between the pillar and the gate electrode. The first source/drain region, the second source/drain region and the gate electrode may be electrically insulated from one other by a gate insulating layer. The gate insulating layer may be a silicon oxide ($SiO_2$) layer, a hafnium oxide ($HfO_2$) layer, a tantalum oxide ($Ta_2O_5$) layer, an oxide/nitride (ON) layer and/or an oxide/nitride/oxide (ONO) layer. An insulating spacer may be provided around the periphery of the pillar and the insulated gate electrode. A contact pad may be on the second source/drain region and a storage electrode may be on the contact pad. A gate signal line may contact the gate electrode and the gate electrode, the gate signal line and/or the first source/drain signal line may be formed of a transition metal layer, a transition metal nitride layer and/or a transition metal silicide layer.

In yet other embodiments, vertical channel semiconductor devices include a semiconductor substrate including a pillar. An insulated gate electrode is around a periphery of the pillar. A first source/drain region is disposed on the semiconductor substrate below the gate electrode and around the periphery of the gate electrode. A second source/drain region is in an upper region of the pillar. A first source/drain signal line is on the sidewall of the first source/drain region that overlaps a portion of the gate electrode and is insulated therefrom. The first source/drain signal line has a tapered upper surface in a region thereof overlapping the gate electrode.

In some embodiments of the present invention, methods of manufacturing a vertical channel semiconductor device include forming a pillar on a semiconductor substrate having a vertical depth and an upper surface displaced from the semiconductor substrate. An isotropic space is formed in the pillar at a predetermined position vertically spaced from the upper surface of the pillar. A gate insulating layer is formed on the pillar including the isotropic space. The isotropic space of the pillar is filled with a conductive material to form a gate electrode around the pillar at a position spaced apart from the upper surface of the pillar by a predetermined distance. A first source/drain region is formed on the semiconductor substrate below the gate electrode and a second source/drain region is formed on the entire upper surface of the gate electrode.

In other embodiments, forming the pillar includes forming a pad oxide layer and a hard mask pattern on the semiconductor substrate and forming pillars by etching the pad oxide layer and the semiconductor substrate to a predetermined depth in the shape of the hard mask pattern. Forming the second source/drain region is preceded by removing the hard mask pattern. Forming the pillar may include etching the semiconductor substrate to a first depth using the hard mask pattern as an etch mask, selectively forming an insulating layer on a sidewall of the etched semiconductor substrate and further etching the semiconductor substrate to a second depth using the hard mask pattern and the insulating layer as an etch mask. Forming the isotropic space may include etching the exposed sidewall of the pillar to a thickness of about 150-500 Å using the hard mask pattern and the insulating layer as an etch mask. Forming the gate insulating layer may include thermally oxidizing a surface of the semiconductor substrate including the pillar.

In yet further embodiments, between forming the first source/drain region and removing the hard mask pattern, a first source/drain signal line is formed contacting the first source/drain region and a gate signal line is formed contacting the gate electrode. Forming the first source/drain signal line may include etching the first source/drain region to a predetermined depth, forming an isotropic space in the first source/drain region at a position spaced apart from an upper surface of the first source/drain region by a predetermined distance, filling a conductive layer in the isotropic space in the first source/drain region and etching the semiconductor substrate to a predetermined depth to separate the first source/drain region from an adjacent source drain region associated with another of the pillars. Forming the isotropic space in the first source/drain region may include forming an insulating spacer to fill a row directional gap between the pillars, etching the first source/drain region to a selected depth using the insulating spacer as an etch mask, selectively forming an insulating layer on a sidewall of the exposed first source/drain region, etching the drain region to a further depth using the insulating spacer as an etch mask and isotropically etching the first source/drain region exposed with a portion of the sidewall thereof covered with the insulating layer.

In other embodiments, forming the first source/drain signal line includes etching the first source/drain region to a predetermined depth, forming a conductive spacer on a sidewall of the first source/drain region to form the first source/drain signal line and etching, using the conductive spacer an etch mask, the semiconductor substrate to separate the first source/drain region from an adjacent source drain region associated with another of the pillars. Forming the gate signal line may include depositing a first interlayer insulating layer on the semiconductor substrate including the first source/drain signal line thereon, etching a portion of the first interlayer insulating layer to form a line groove that is perpendicular to the first source/drain signal line and exposes the gate electrode of the pillar, filling the line groove with a conductive layer contacting with the gate electrode, etching back the conductive layer to a predetermined thickness and then filling the line groove with a second interlayer insulating layer. After forming of the second source/drain region, conductive layer may be on the second interlayer insulating layer to fill a space from which the hard mask pattern is removed and the conductive layer may be planarized to form a contact pad. A storage electrode may be formed on the contact pad.

In yet further embodiments, method of manufacturing a vertical channel semiconductor device include forming a pillar having a vertical depth on a semiconductor substrate and forming a gate electrode around a periphery of the pillar. A first source/drain region is formed on the semiconductor substrate below the gate electrode. The first source/drain region is etched to a predetermined depth to expose a sidewall of the first source/drain region. An isotropic space is formed on the sidewall of the first source/drain region vertically spaced apart from an upper surface of the first source/drain region by a predetermined distance. The isotropic space is filled with a conductive layer to form a first source/drain signal line. A second source/drain region is formed on an exposed upper surface of the pillar.

In other embodiments, forming the pillar includes forming a pad oxide layer and a hard mask pattern on the semiconductor substrate, forming the pillar by etching the pad oxide layer and the semiconductor substrate to a predetermined depth in the shape of the hard mask pattern. Forming the second source/drain region is preceded by separating the first source/drain region from adjacent source/drain regions and removing the hard mask pattern. Forming the pillar may include etching the semiconductor substrate to a first depth using the hard mask pattern as an etch mask, selectively forming an insulating layer on the sidewall of the etched semiconductor substrate and further etching the semiconductor substrate to a second depth using the hard mask pattern and the insulating layer as an etch mask. Forming the gate electrode may include isotropically etching the pillar using the hard mask pattern and the insulating layer as an etch mask to form an isotropic space, forming a gate insulating layer on the surface of the pillar including the isotropic space and filling the isotropic space with a conductive layer.

In yet other embodiments, forming the gate electrode includes anisotropically etching the pillar to a predetermined width using the hard mask pattern as an etch mask and covering the periphery of the pillar with a conductive layer. The method may further include forming a gate signal line contacting the gate electrode after forming the first source/drain signal line and before removing the hard mask pattern. Forming the gate signal line may include depositing a first interlayer insulating layer on the semiconductor substrate including the first source/drain signal line, etching a predetermined portion of the first interlayer insulating layer to form a line groove that is perpendicular to the first source/drain signal line and exposes the gate electrode of the sidewall of the pillar, filling the line groove with an conductive layer contacting the gate electrode, etching back the conductive layer to a predetermined thickness and then filling the line groove with a second interlayer insulating layer.

In some embodiments, after forming the second source/drain region, a conductive layer is deposited on the second interlayer insulating layer to fill a space from which the hard mask pattern is removed. The conductive layer is planarized to form a contact pad. A storage electrode is formed on the contact pad.

BRIEF DESCRIPTION OF THE DRAWINGS

The above and other features and advantages of the present invention will become more apparent by describing in detail exemplary embodiments thereof with reference to the attached drawings in which:

FIGS. 4A through 4J are cross-sectional views illustrating a method of manufacturing a vertical channel semiconductor device according to some embodiments of the present invention, with regions "X1", "X2" and "Y" in FIGS. 4A through 4J being sections taken along lines X1-X1', X2-X2' and Y-Y' in FIG. 2, respectively;

FIGS. 8A through 8D are cross-sectional views illustrating a method of manufacturing a vertical channel semiconductor device according to other embodiments of the present invention, with regions "X1", "X2" and "Y" in FIGS. 7A through 7D being sections taken along lines X1-X1', X2-X2' and Y-Y' in FIG. 2, respectively;

DETAILED DESCRIPTION OF THE INVENTION

Figure 1:
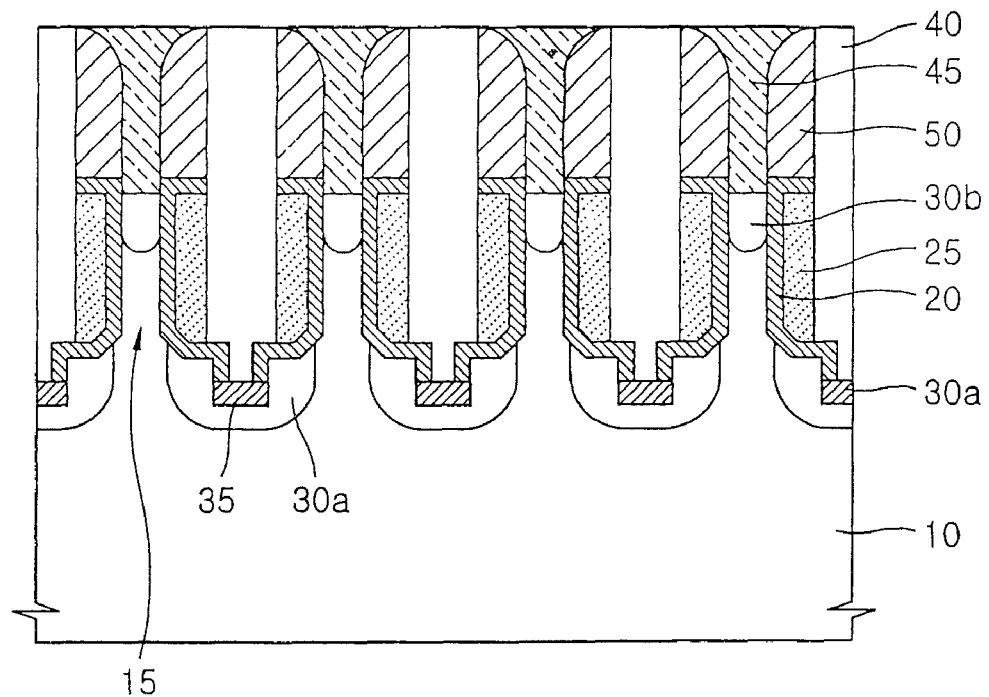
FIG. 1 is a cross-sectional view of a conventional vertical channel semiconductor device.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In some embodiments of the present invention, a vertical channel semiconductor device is formed to have a gate electrode that is formed spaced apart from the upper surface of pillar by a predetermined distance so that a source region can be formed on the entire upper surface of the pillar. The gate electrode is insulated from and spaced apart from the upper surface of the pillar by the predetermined distance. Accordingly, the source can be formed on the entire area of the pillar and, thus, a contact pad can be formed to contact with the entire surface of the source. Consequently, it may be possible to improve (or reduce) the source contact resistance in some embodiments of the present invention.

In some embodiments, the vertical channel semiconductor device is also formed to have an isotropic space on the sidewall of the drain region and a conductive layer filled in the isotropic space to form a bit line. As the bit line is formed in the isotropic space of a drain region, its contact area with the drain region can increase, which may improve (reduce) the drain contact resistance.

Figure 2:
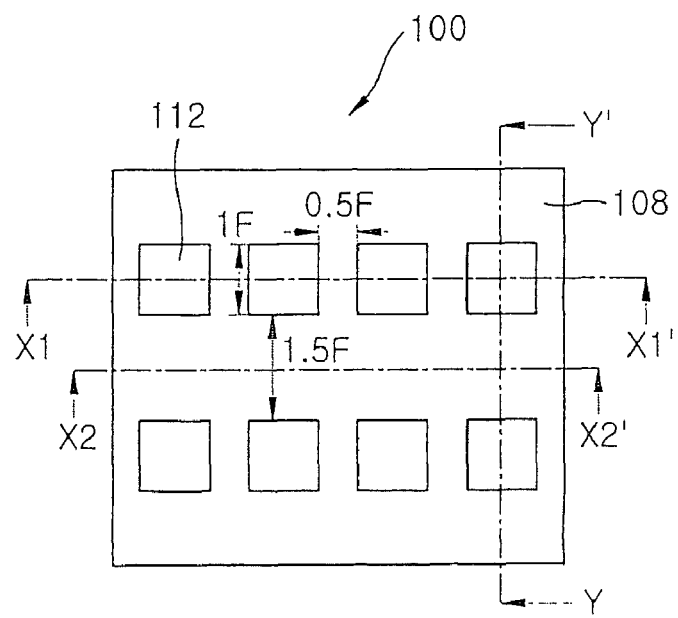
FIG. 2 is a plan view illustrating a photoresist pattern for defining a hard mask pattern formed on a hard mask layer according to some embodiments of the present invention.

Embodiments of the present invention will now be further described with reference to the FIGS. 2 through 4J. FIG. 2 is a plan view of a semiconductor device with a photoresist pattern for defining a hard mask pattern formed on a hard mask layer according to some embodiments of the present invention. FIGS. 3A through 3J are perspective views illustrating a method of manufacturing a vertical channel semiconductor device according to some embodiments of the present invention. FIGS. 4A through 4J are cross-sectional views further illustrating the method of FIGS. 3A-3J. Specifically, portions "X1", "X2" and "Y" in FIGS. 4A through 4J are sections taken along lines X1-X1', X2-X2' and Y-Y' in FIG. 2, respectively.

Figure 3A:
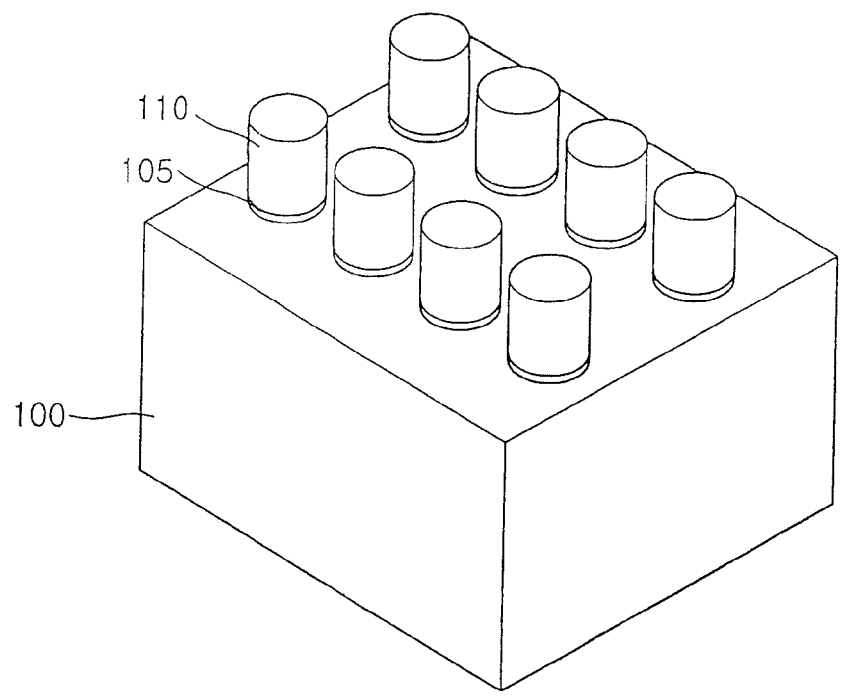
FIGS. 3A through 3J are perspective views illustrating a method of manufacturing a vertical channel semiconductor device according to some embodiments of the present invention.

Referring to FIGS. 2, 3A and 4A, a pad oxide layer 105 and a hard mask layer 108 are sequentially deposited on a semiconductor substrate 100. The pad oxide layer may be a silicon oxide layer formed by thermal oxidation, and may be formed to a thickness of about 50-150 Å. The hard mask layer 108 may be formed of a material having an etch selectivity with respect to the semiconductor substrate 100 (e.g., a silicon substrate) and the pad oxide layer 105, and the material of the hard mask layer 108 may be a silicon oxide and/or a silicon nitride.

Photoresist patterns 112 for defining transistor regions may be formed on the hard mask layer 108 by photolithography. The photoresist pattern 112 may have the shape of a square whose side has a length of 1 F (where F is the minimum feature size). Also, the hard mask patterns 112 neighboring in an X-axis direction may have a 0.5-F gap therebetween, and the hard mask patterns 112 neighboring in a Y-axis direction may have a 1.5-F gap therebetween. Using the photoresist pattern, the hard mask layer 108 may be etched to form a hard mask pattern 110. The hard mask pattern 110 may be used as a mask for defining a region in which the transistor will be formed. Although the photoresist pattern 112 is illustrated in the shape of a square in FIG. 2, the resulting etched pattern 110 may have the shape of a cylinder, as illustrated in FIG. 3A, due to abrasion that may occur during the etching process.

Figure 3B:
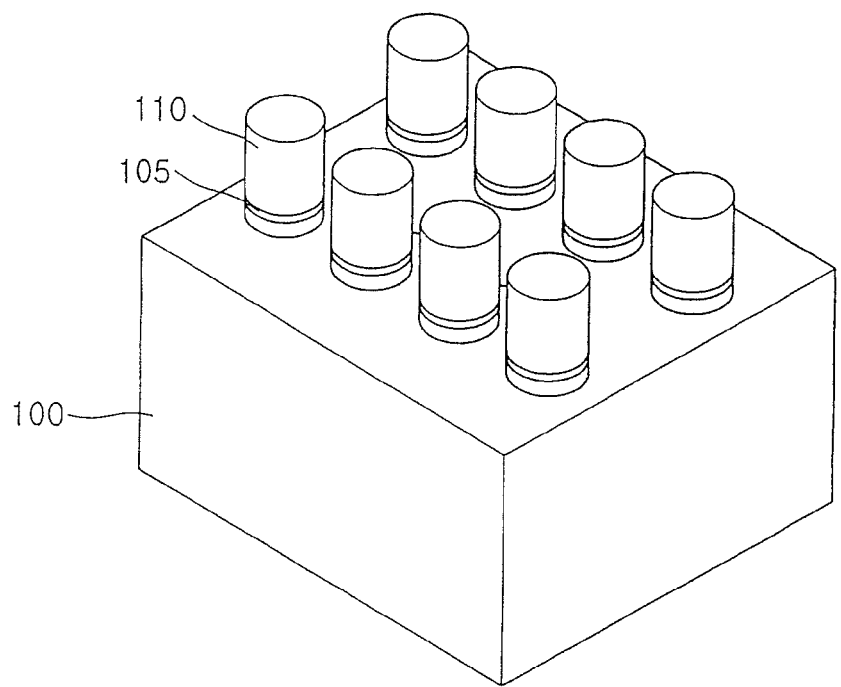

Referring to FIGS. 3B and 4B, using the hard mask pattern 110 as an etch mask, the exposed semiconductor substrate 100 may be etched to a relatively small depth of, for example, about 100-300 Å.

Figure 3C:
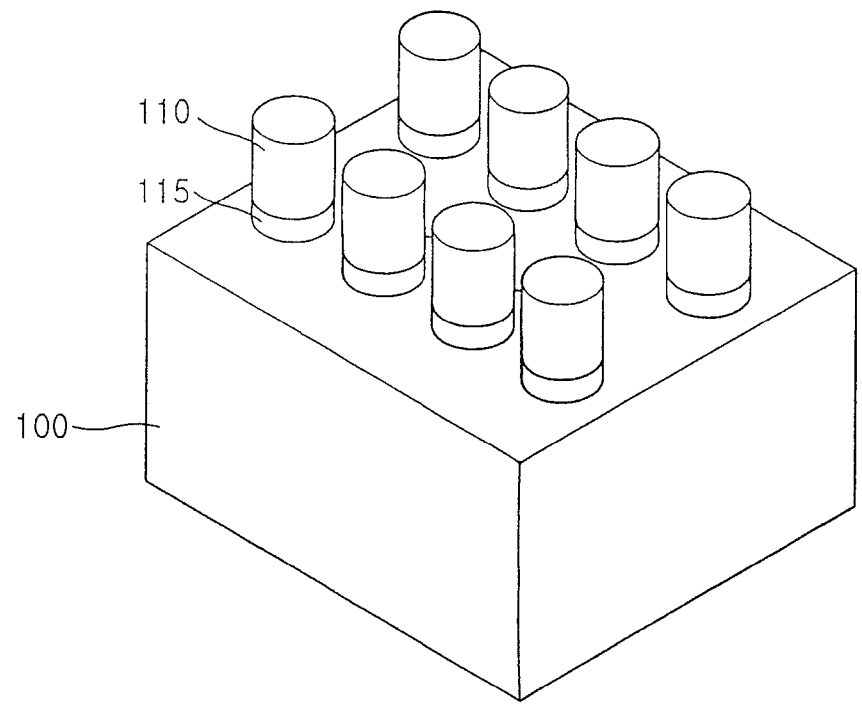
Figure 4C:
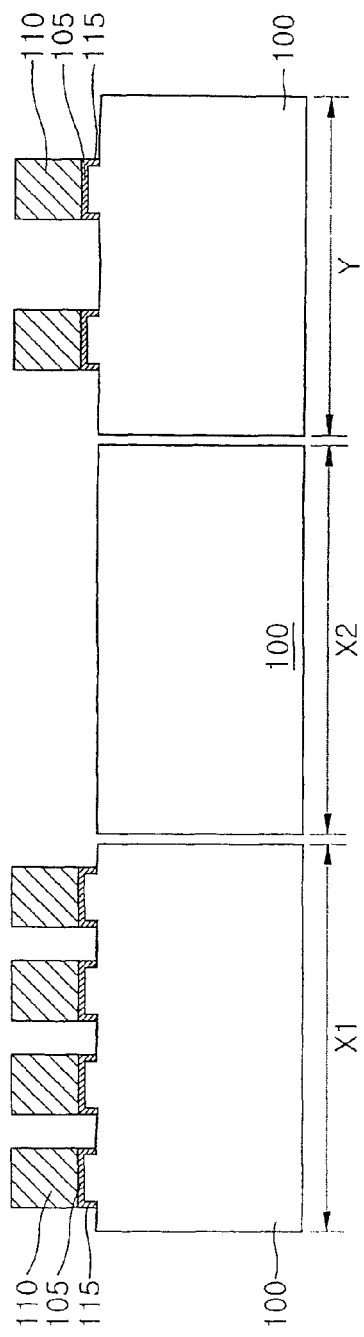

Referring to FIGS. 3C and 4C, a first insulating layer 115 is shown formed on the surface of the exposed semiconductor substrate 100. The first insulating layer 115 may be a silicon oxide layer, and may be formed by depositing an oxide layer on the resulting structure of the semiconductor substrate 100 and/or by oxidizing the surface of the semiconductor substrate 100. Thereafter, an anisotropic etch-back process is performed on the first insulating layer 115 to expose the surface of the hard mask pattern 110 and the surface of the semiconductor substrate 100, such that the first insulating layer 115 remains on the sidewall of the semiconductor substrate 100 corresponding to the sidewall of the hard mask pattern 110.

Figure 3D:
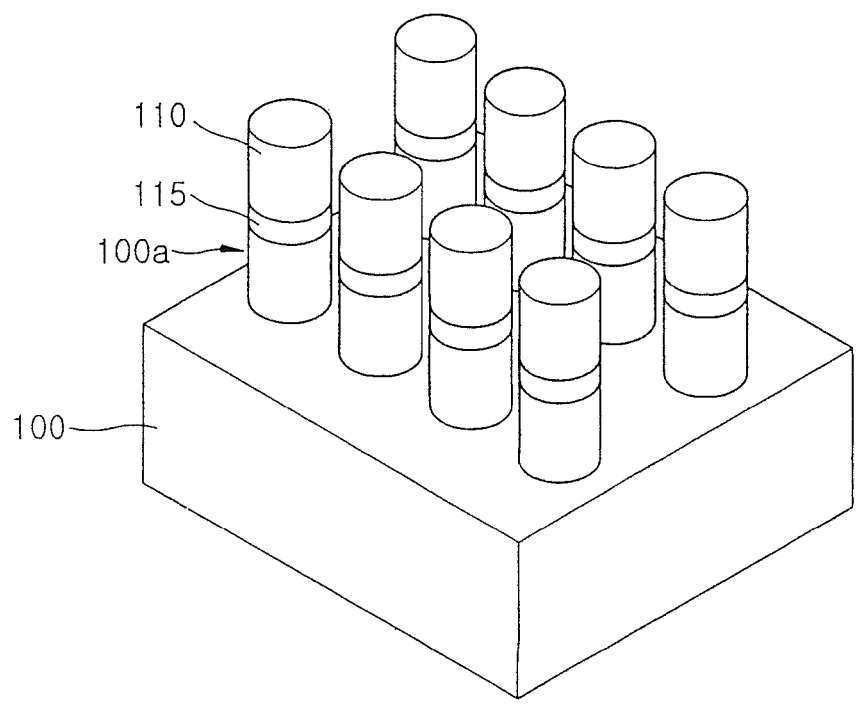
Figure 4D:
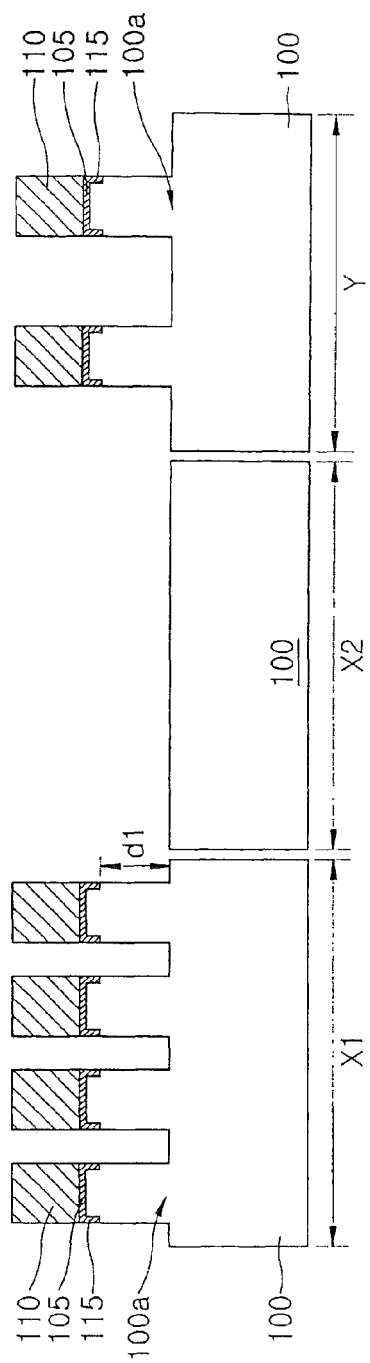

Referring to FIGS. 3D and 4D, using the hard mask pattern 110 as an etch mask, the exposed semiconductor substrate 100 may be dry-etched to a predetermined depth of, for example, 800-1500 Å to form pillars 100a.

Figure 3E:
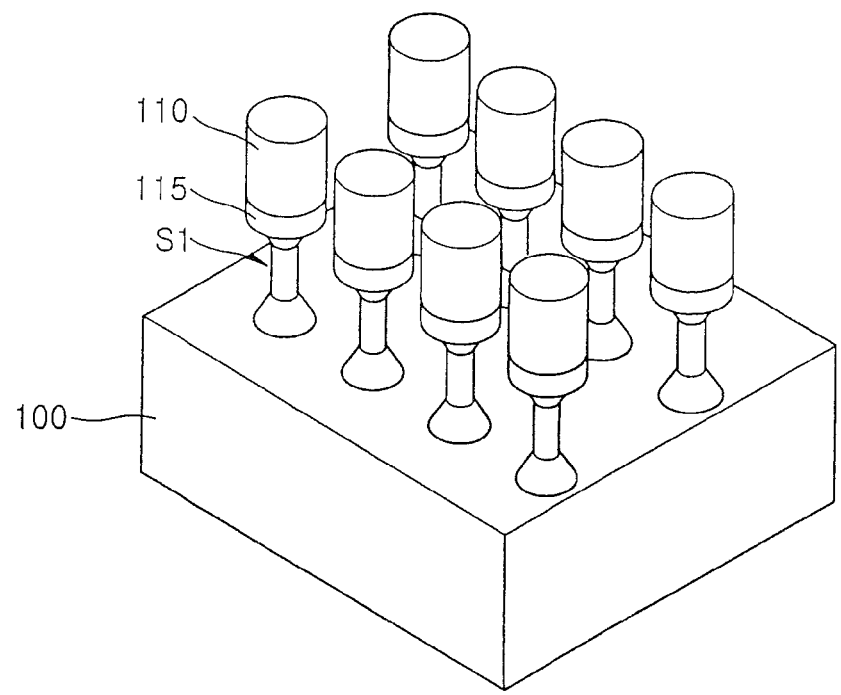

Referring to FIGS. 3E and 4E, using the hard mask pattern 110 and the first mask layer 115 remaining on a portion of the sidewall of the pillar 100a as an etch mask, the resulting structure of the semiconductor substrate 100 may be isotropically etched to a depth of about 150-500 Å. Consequently, an isotropic space S1 is provided on the sidewall of the pillar 100a. As the first insulating layer 115 remains on a portion of the sidewall of the pillar 100a, the isotropic space S1 is formed on the side wall region of the pillar 100a spaced apart from the bottom surface of the pad oxide layer 105 by a predetermined distance.

Figure 3F:
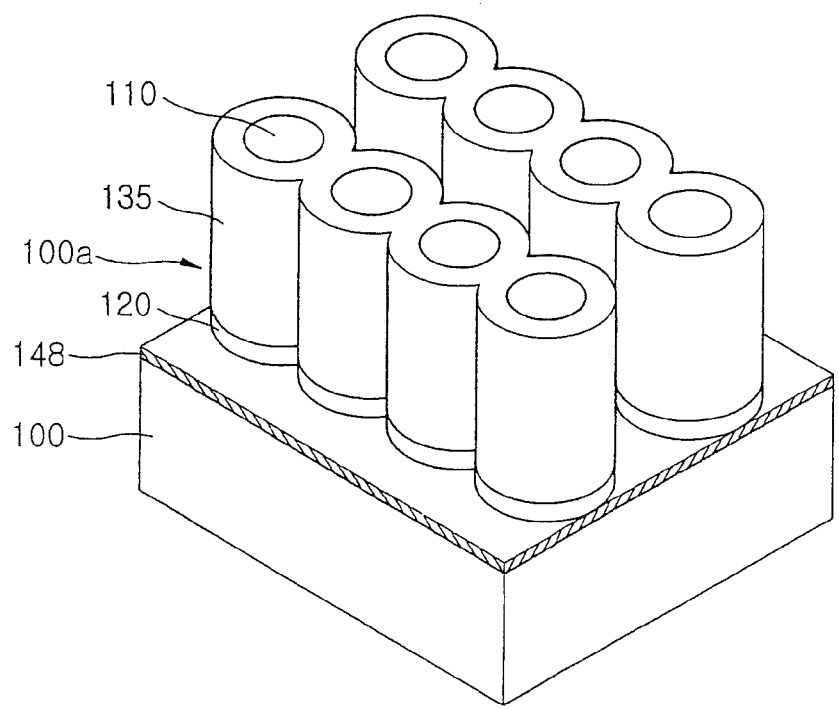

Referring to FIGS. 3F and 4F, a gate insulating layer 120 is formed on the semiconductor substrate 100 including the isotropic space S1. The gate insulating layer 120 may be formed by deposition and/or oxidation, and may be formed using a silicon oxide ($SiO_2$) layer, a hafnium oxide ($HfO_2$) layer, a tantalum oxide ($Ta_2O_5$) layer, an oxide/nitride (ON) layer, and/or an oxide/nitride/oxide (ONO) layer.

A gate electrode material, for example, an n-type impurity doped polysilicon layer, a p-type impurity doped polysilicon layer and/or a silicon germanium layer, is shown deposited on the resultant structure of the semiconductor substrate on which the gate insulating layer 120 is formed. For example, the gate electrode material may be formed to such a thickness as to fill the isotropic space S1. Thereafter, the gate electrode material is anisotropic etched-back to expose the hard mask pattern 110 and the gate insulating layer 120, thereby forming a gate electrode 125 surrounding the pillar 100a in the isotropic space S1 of the pillar 100a. The gate electrode 125 is shown formed spaced apart from the upper surface of the pillar 100a by the length of the first insulating layer 115.

Thereafter, junction region impurities, for example, phosphorus (31P) ions or arsenic (75As) ions, may be implanted into the semiconductor substrate 100 covered with the gate insulating layer 120 between the hard mask patterns 110, thereby forming a drain region 130.

A second insulating layer is deposited on the resulting structure of the semiconductor substrate 100. The second insulating layer may be formed to such a thickness as to fill a row (or line X1-X1') directional gap between the mask patterns 110, and may be formed using a silicon oxide layer. Thereafter, the second insulating layer may be anisotropically etched to form insulating spacers 135 on the sidewalls of the hard mask patterns 110 and the gate electrodes 125. As illustrated in FIG. 4F, the insulating spacer 135 fills a row directional gap between the pillars 100a, but does not fill a column (line Y-Y') directional gap of the pillars 100a to leave exposed a portion of the drain region 130.

A transition metal layer (not illustrated) may be formed on the resulting structure of the semiconductor substrate 100 to a predetermined thickness. The transition metal layer may be formed of a material that may be selected from the group consisting of titanium, tantalum, tungsten, nickel, and cobalt. Thereafter, the transition metal layer may be thermally processed to form a silicide layer 148 on the exposed portion of the semiconductor substrate 100, that is, on the drain region 130.

Figure 3G:
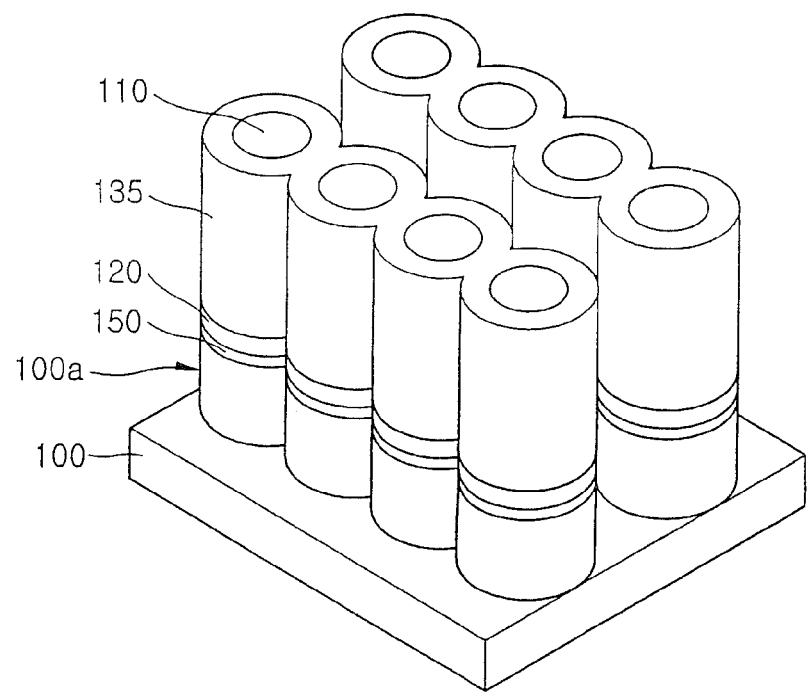
Figure 4G:
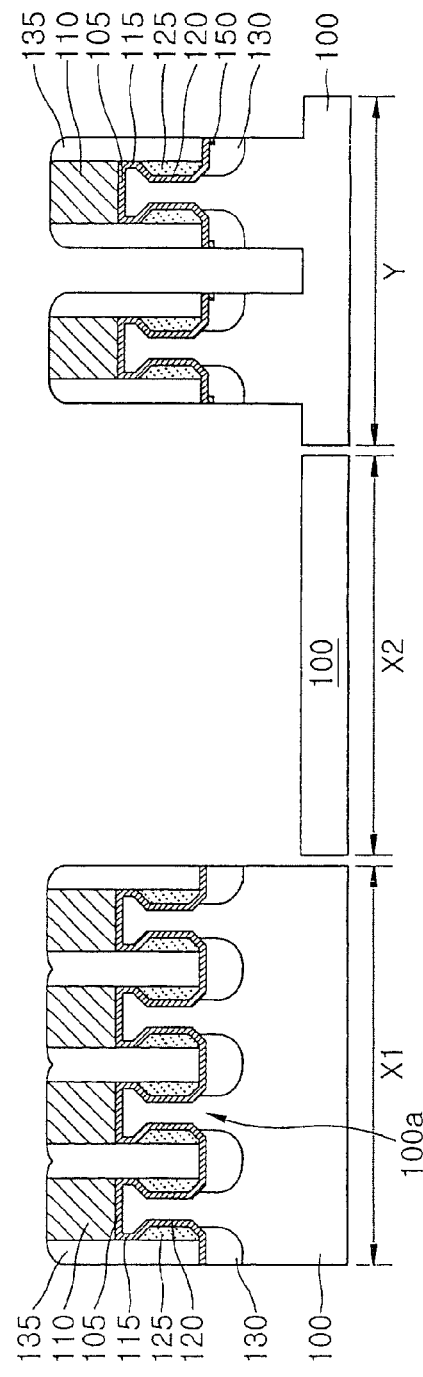

Referring to FIGS. 3G and 4G, the semiconductor substrate 100, including the drain region 130 and the silicide layer 148, is etched using the insulating spacer 135 as an etch mask. Consequently, the pillars 100a arranged in the row direction may be isolated from one another. Also, during the isolation process, the silicide layer 148 may be etched to selectively define a bit line 150 in a predetermined portion of the drain region 130. The bit line 150 may also be referred to as a "drain (or source) signal line". Thereafter, channel stop impurity ions, for example, $BF_2$ ions may be implanted into the semiconductor substrate 100 so as to completely separate channels. The $BF_2$ ions may be implanted at a concentration of $5 \times 10^{13}/cm^2$ to $10^{14}/cm^2$.

Figure 3H:
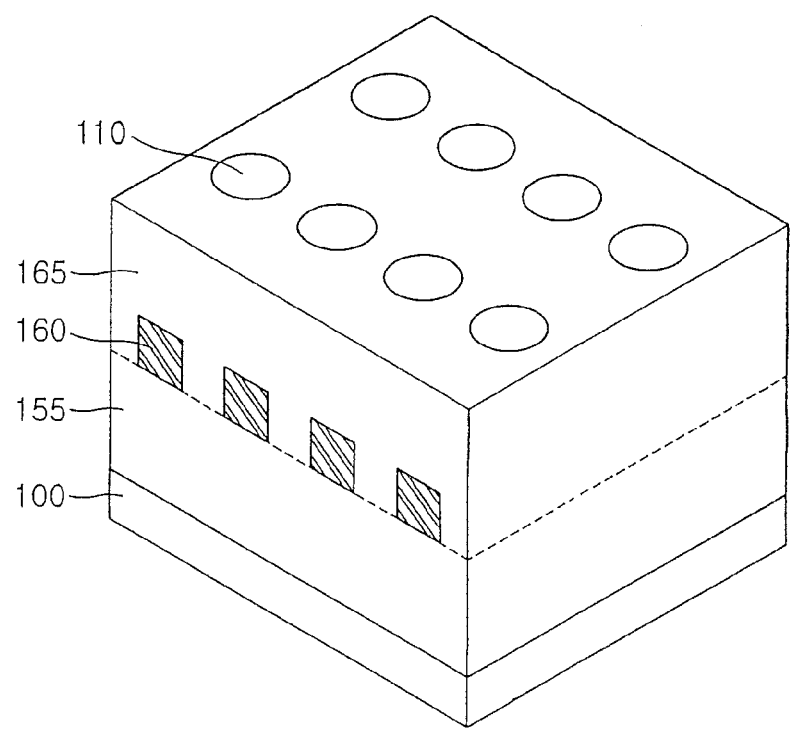
Figure 4H:
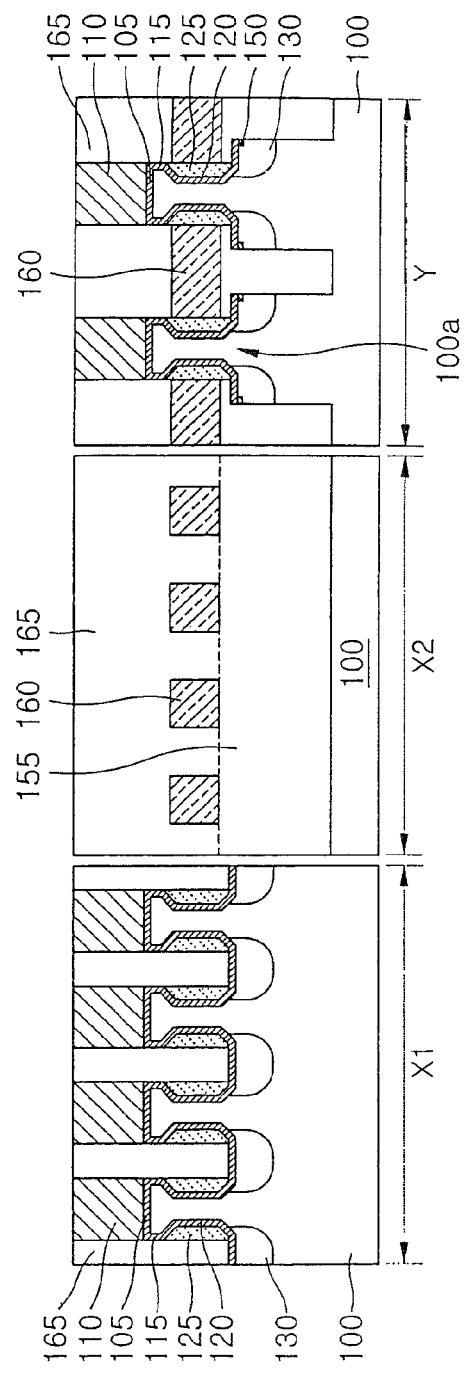

Referring to FIGS. 3H and 4H, a first interlayer insulating layer 155 (e.g., a silicon oxide layer) is shown deposited on the resulting structure of the semiconductor substrate 100 to a thickness of 4000-5000 Å, and then the resulting structure is planarized to expose the surface of the hard mask pattern 110. Thereafter, a predetermined portion of the first interlayer insulating layer 155 is etched to define a region for forming word lines, which will be referred to herein as a wordline-intended region. The wordline-intended region is a line groove exposing the gate electrodes 125 of the pillars 100a that are parallel in the column direction. The wordline-intended region may be formed to such a depth as to expose the gate electrode 125, for example, about 1500-2000 Å, and may be formed substantially perpendicular to the bit line.

Thereafter, a wordline conductive layer (e.g., a doped polysilicon layer, a transition metal layer and/or a transition metal silicide layer) is deposited on the resulting structure of the semiconductor substrate 100 to fill the wordline-intended region. The wordline conductive layer is planarized to expose the surface of the first interlayer insulating layer 155 and is then etched to a thickness of 500-1000 Å such that it has the same height level as the gate electrode 125, thereby forming a wordline 160. The wordline 160 may also be referred to as a "gate signal line. The wordline 160 electrically contacts with the gate electrode 125 and extends perpendicular to the bit line 150. A second interlayer insulating layer 165 is shown deposited to a thickness of about 100-1500 Å on the resulting structure where the wordline 160 is formed and then planarized to expose the hard mask pattern 110.

Figure 3I:
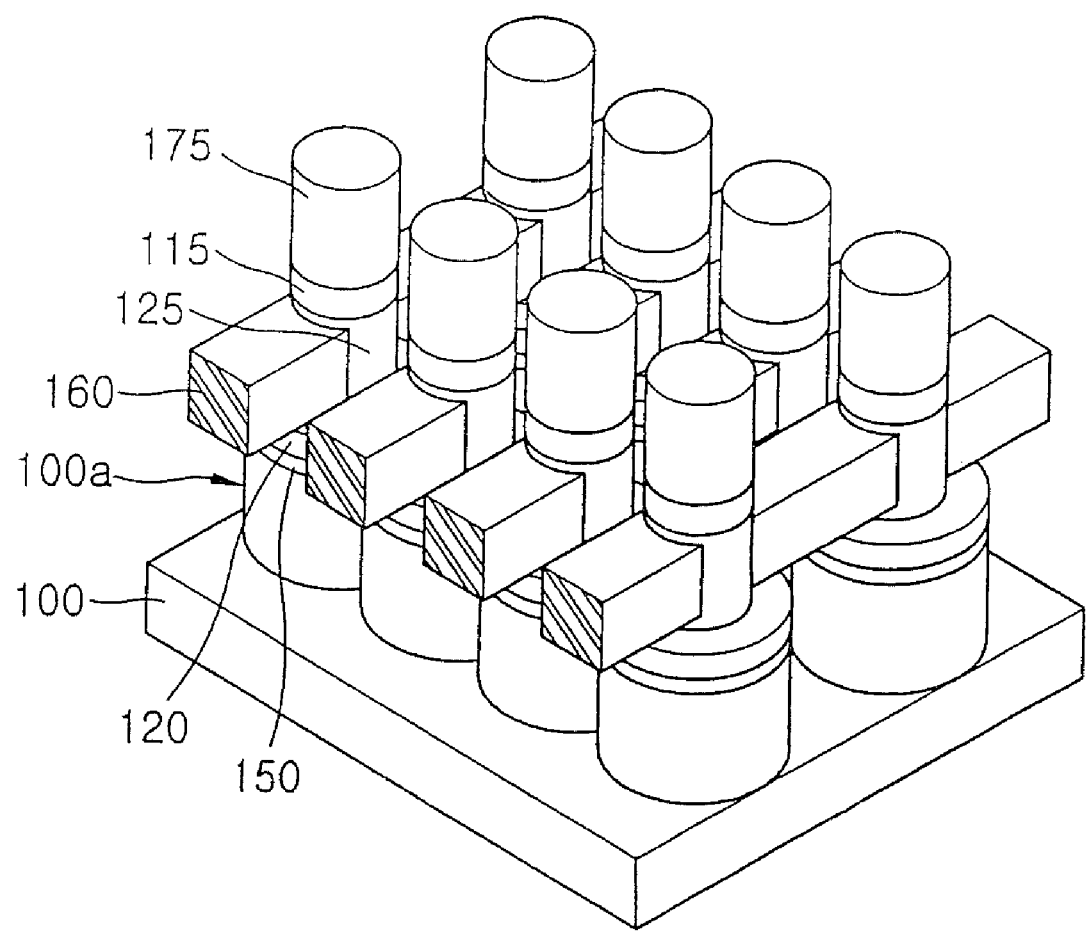
Figure 4I:
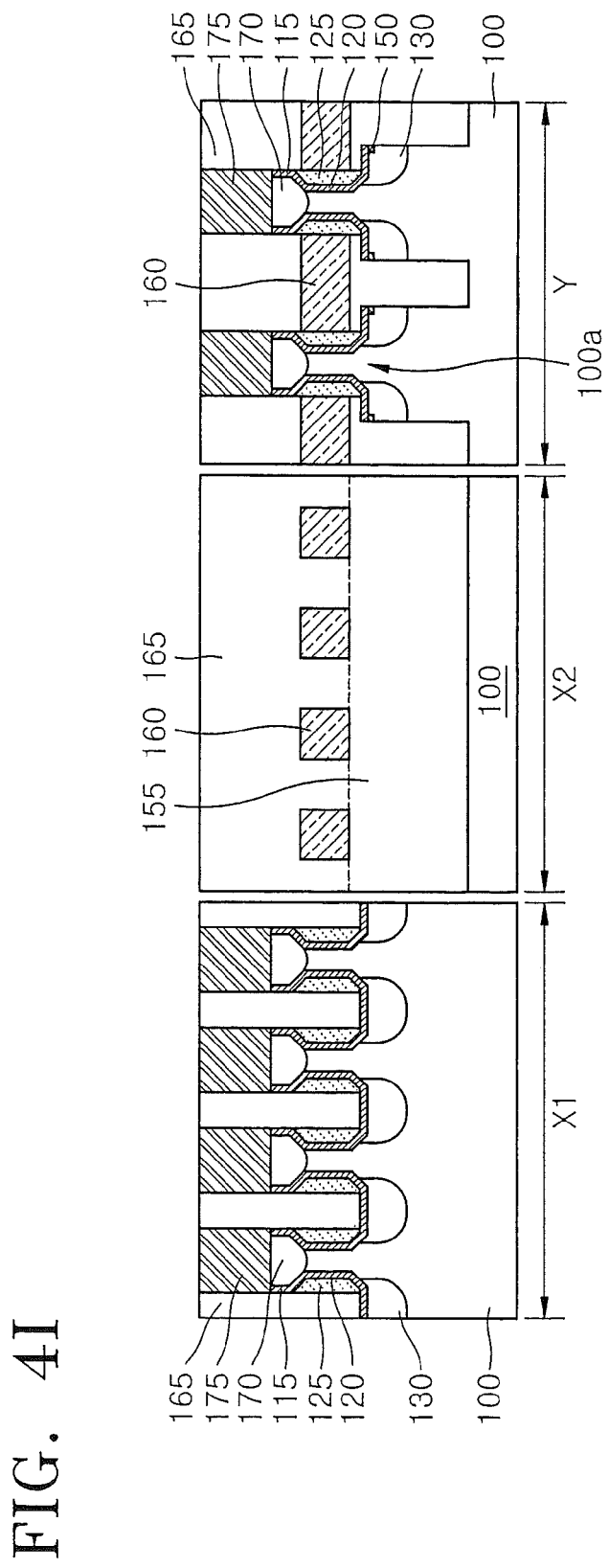

Referring to FIGS. 3I and 4I, the exposed hard mask pattern 110 is removed. Thereafter, junction region impurities (e.g., phosphorus ions and/or arsenic ions) are implanted into the exposed region of the semiconductor substrate 100 (i.e., the surface of the pillar 100a) to form a source region 170. The gate electrode 125 is formed spaced apart from the upper surface of the pillar 100a, and the gate electrode 125 and the pillar 100a are insulated with the gate insulating layer 120 therebetween. Therefore, the source region 170 can be formed on the entire surface of the pillar 100a. And then, the pad oxide layer 105 formed on the source region may be removed using well known method.

Next, a conductive layer (e.g., a doped polysilicon layer, a metal layer and/or a silicide layer) may be deposited to a thickness of 500-1000 Å on the second interlayer insulating layer 165 to contact with the source region 170 and fill the space between the second interlayer insulating layers 165. Thereafter, the deposited conductive layer may be planarized to form source contact pads 175. As the source contact pad 175 is formed in a region where the hard mask pattern 110 was formed and then removed, its contact area with the source region 170 can be increased. In addition, due to the first insulating layer 115, the gate electrode 125 is disposed spaced apart from the surface of the semiconductor substrate 100 by a predetermined distance. Therefore, the source contact pad 175 can be formed in the entire region where the hard mask pattern was formed, without interposing an insulating material (e.g., a spacer).

Figure 3J:
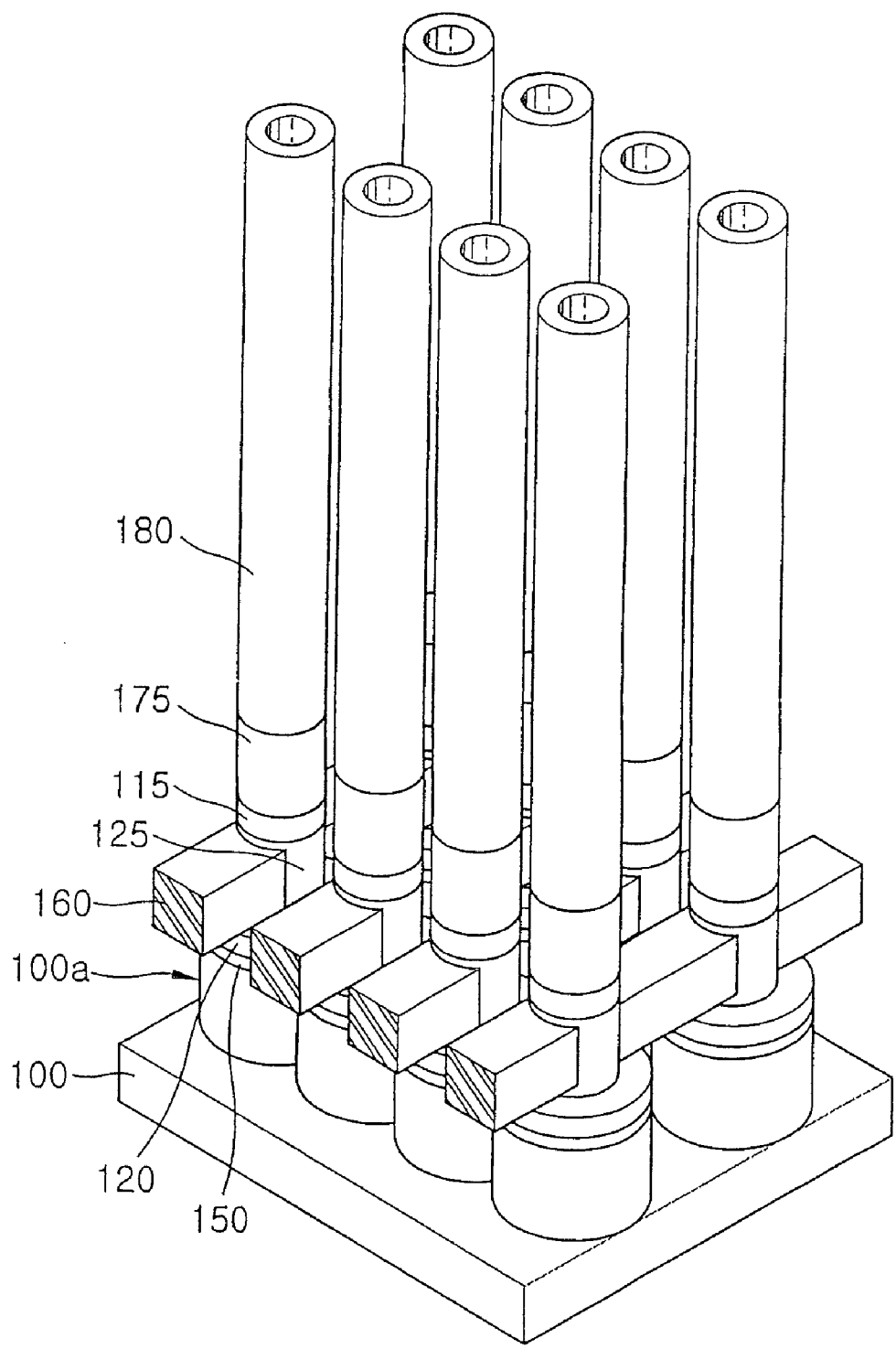
Figure 4J:
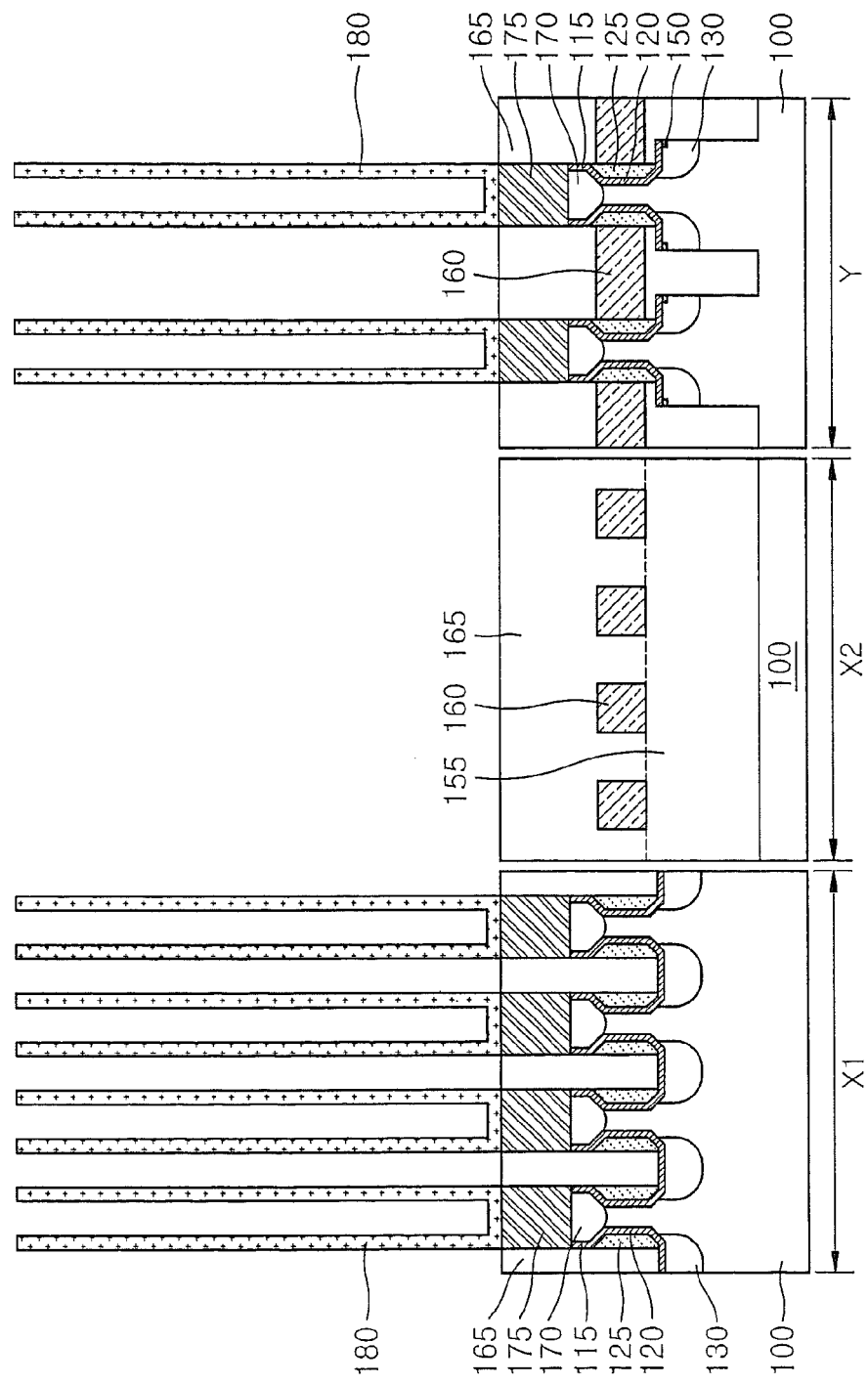

Referring to FIGS. 3J and 4J, a cylindrical storage electrode 180 is formed on the source contact pad 175. As shown in FIG. 4J, the gate electrode 125 is formed around the periphery of the pillar 100a at a position spaced apart from the upper surface of the pillar 100a. Accordingly, the entire upper surface of the pillar 100a is provided as the source region 170.

In addition, the gate electrode 125 is electrically insulated from the source region 170 by the gate insulating layer 120 and the first insulating layer 115. Therefore, the contact pad 175 occupying the entire area of a source region 170a can be formed without providing a spacer to insulate it from the gate electrode 125 on the source region 170. As the contact pad 175 can contact with the entire source region 170a, the contact area therebetween can increase to improve (or reduce) the contact resistance.

Further embodiments will now be described with reference to FIGS. 2, 5A-5D and 6A-6D. FIGS. 5A through 5D are perspective views illustrating a method of manufacturing a vertical channel semiconductor device according to further embodiments of the present invention. FIGS. 6A through 6D are cross-sectional views further illustrating the embodiments of FIGS. 5A through 5D. Specifically, portions "X1", "X2" and "Y" in FIGS. 6A through 6D are cross-sections taken along lines X1-X1', X2-X2' and Y-Y' in FIG. 2, respectively.

Figure 5A:
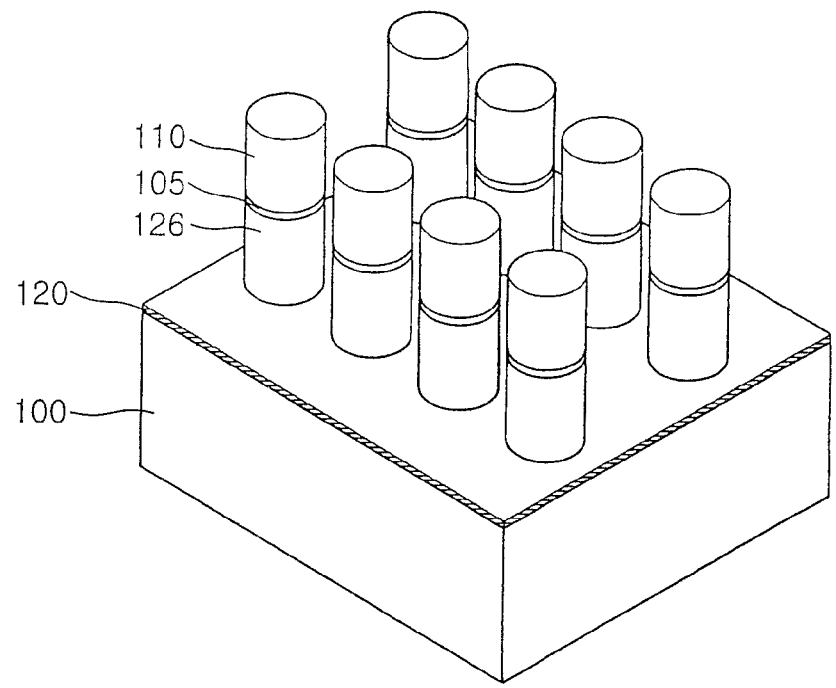
FIGS. 5A through 5D are perspective views illustrating a method of manufacturing a vertical channel semiconductor device according to further embodiments of the present invention.
Figure 6A:
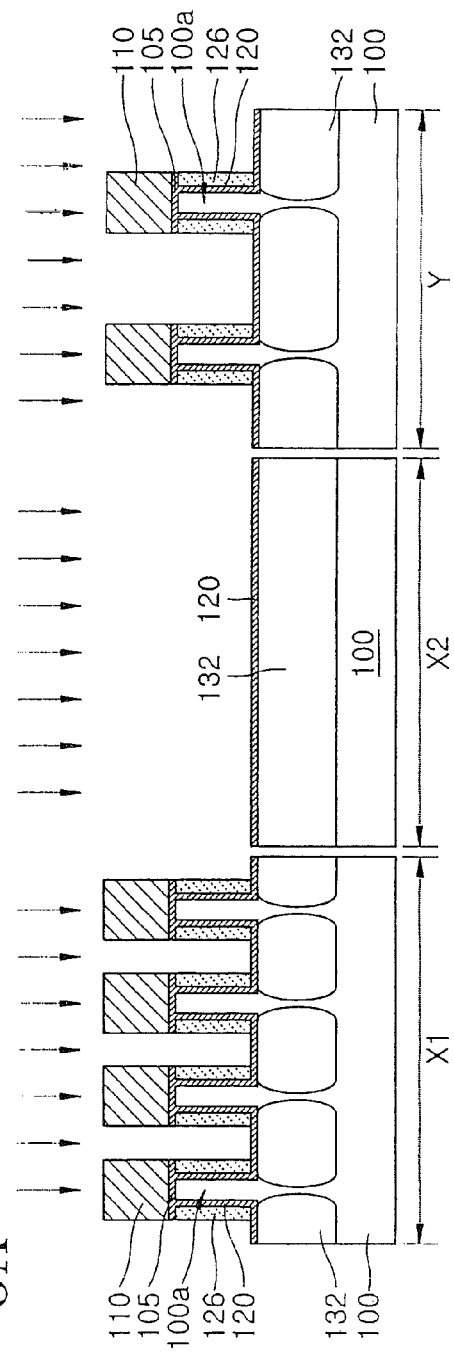
FIGS. 6A through 6D are cross-sectional views illustrating a method of manufacturing a vertical channel semiconductor device according to further embodiment of the present invention, with regions "X1", "X2" and "Y" in FIGS. 6A through 6D being sections taken along lines X1-X1', X2-X2' and Y-Y' in FIG. 2, respectively.

As described for the previous embodiments, a pad oxide layer 105 and a hard mask pattern 110 are sequentially formed on a semiconductor substrate 100, and then the semiconductor substrate 100 is etched in the shape of the hard mask pattern 110 to a thickness of 800-1500 Å to form pillars 100a. Referring to FIGS. 5A and 6A, using the hard mask pattern 110 as an etch mask, the pillars 100a are anisotropically etched to a width of about 200-300 Å to define a gate electrode intended region. The surfaces of the pillar 100a and the semiconductor substrate 100 are thermally oxidized to form a gate insulating layer 120. A gate electrode conductive layer is deposited on the resulting surface of the semiconductor substrate 100 and is anisotropically etched to form a gate electrode 126 around the pillar 100a.

Thereafter, junction region impurities (e.g., phosphorus (31P) ions or arsenic (75As) ions) are implanted into the semiconductor substrate 100 covered with the gate insulating layer 120 between the hard mask patterns 110, thereby forming a drain region 132. The junction region impurities may be implanted to a relatively large penetration depth Rp of about 800-1200 Å. In some embodiments, the drain region 132 has an actual depth of about 1500-2000 Å.

Figure 5B:
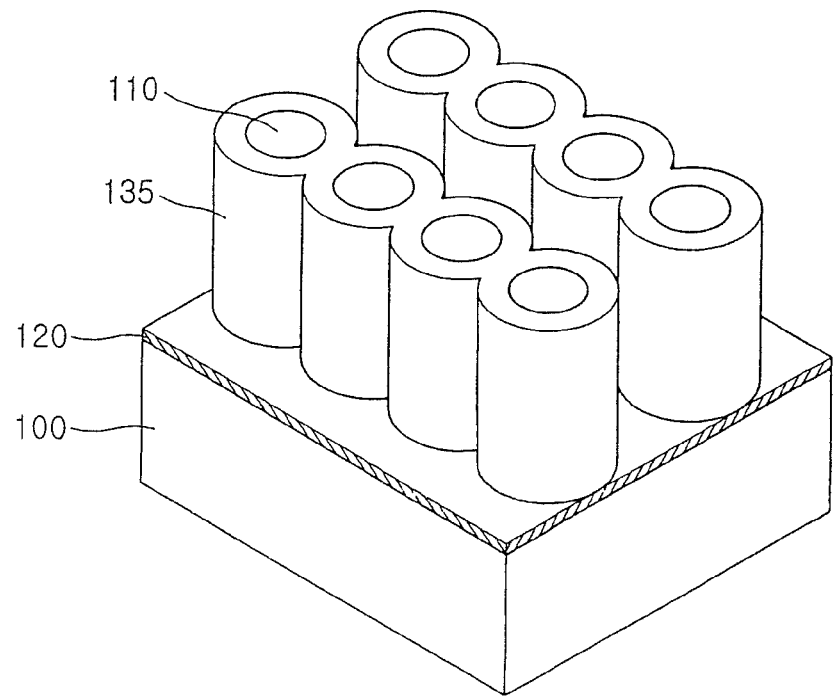
Figure 6B:
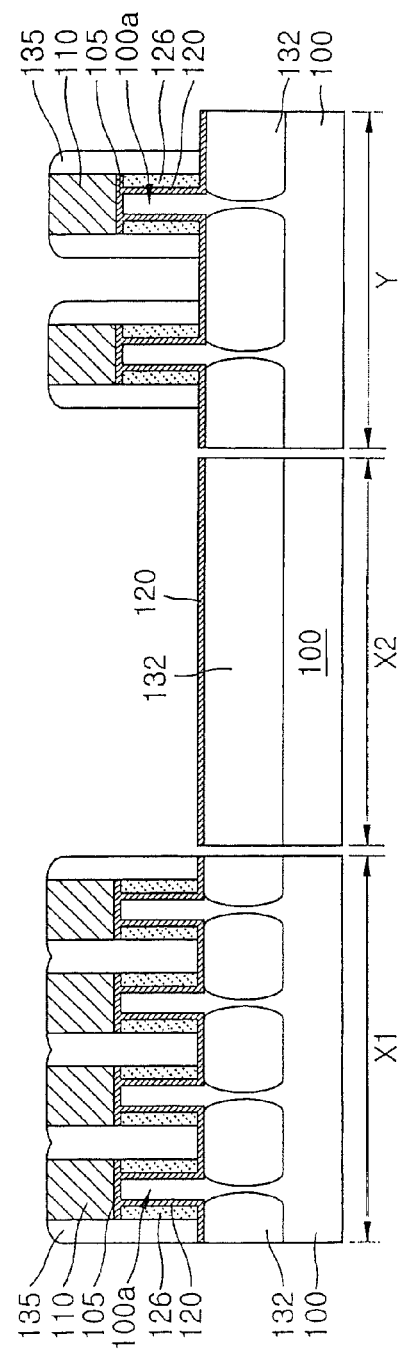

Referring to FIGS. 5B and 6B, a second insulating layer is deposited on the resulting structure of the semiconductor substrate 100 in which the drain region 132 is formed. The second insulating layer may be deposited using a silicon oxide layer. The second insulating layer may be deposited to such as a thickness as to fill a row directional gap between the hard mask patterns 110. The second insulating layer is anisotropically etched to expose the hard mask pattern 110 and the gate insulating layer 120, thereby forming insulating spacers 135 on the sidewalls of the hard mask pattern 110 and the gate electrode 125.

Figure 5C:
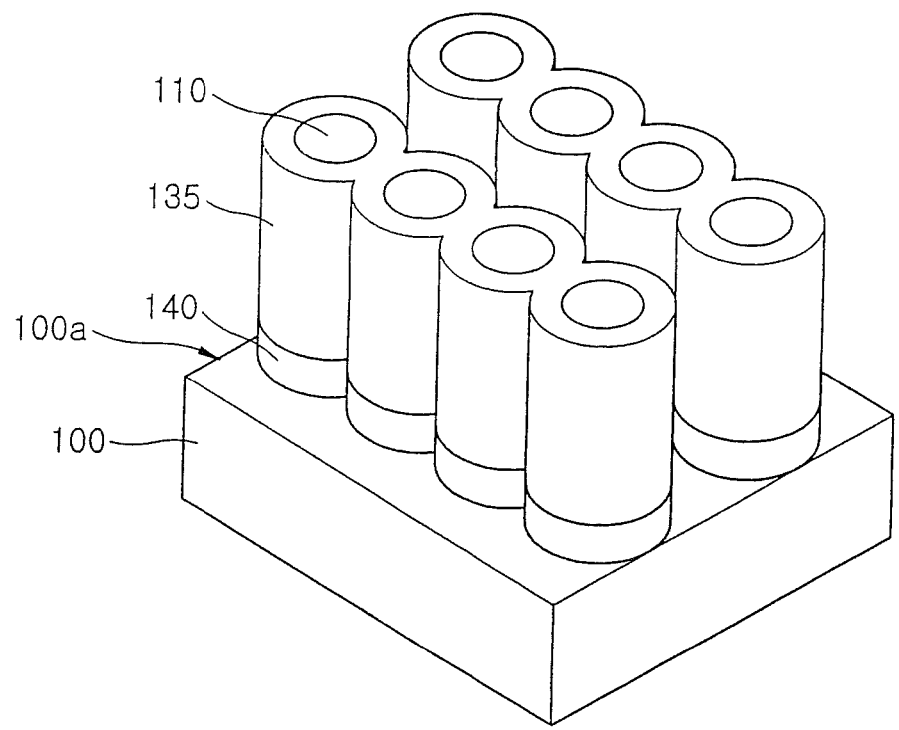
Figure 6C:
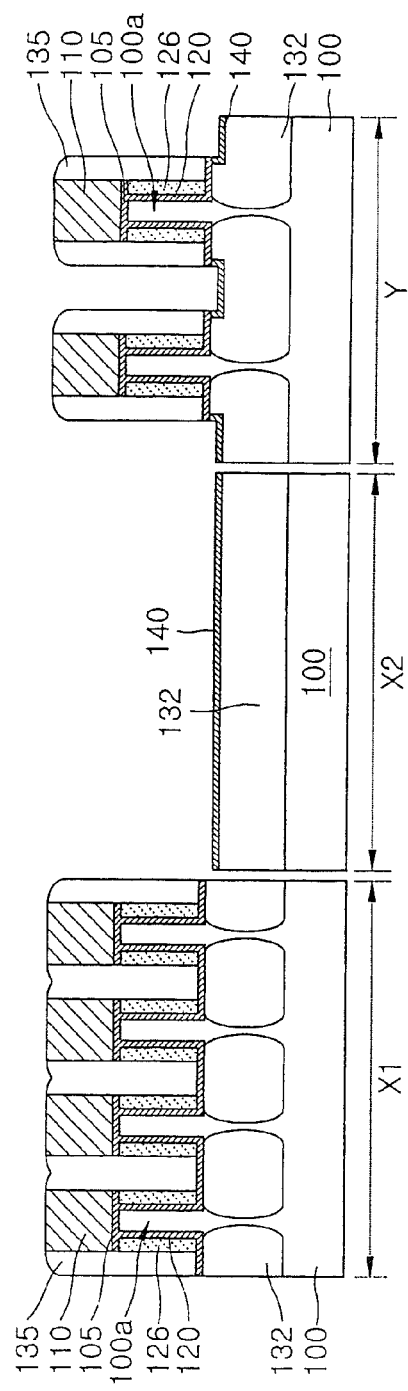

Referring to FIGS. 5C and 6C, using the insulating spacers 135 as an etch mask, the exposed drain region 132 is etched to a depth smaller than the depth of the drain region 132, for example, 200-300 Å. Consequently, a predetermined portion of the sidewall of the drain region 132 is exposed. A third insulating layer 140 is formed on the exposed surface of the semiconductor substrate 100, that is, the side and bottom surfaces of the drain region 132. The third insulating layer 140 may be a silicon oxide layer formed by oxidation or deposition, and may be formed to a thickness of about 100-200 Å.

Figure 5D:
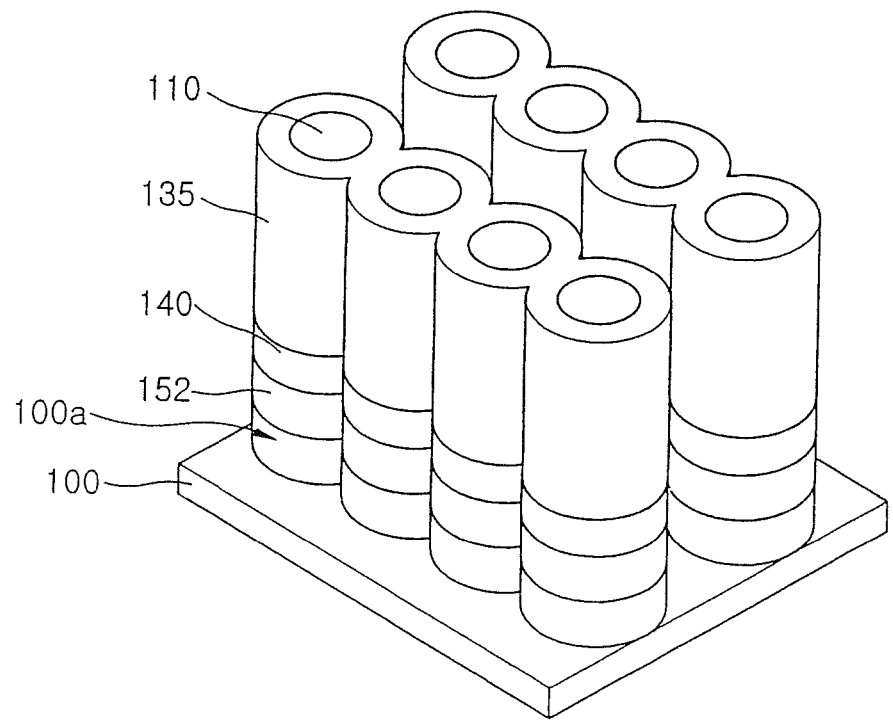
Figure 6D:
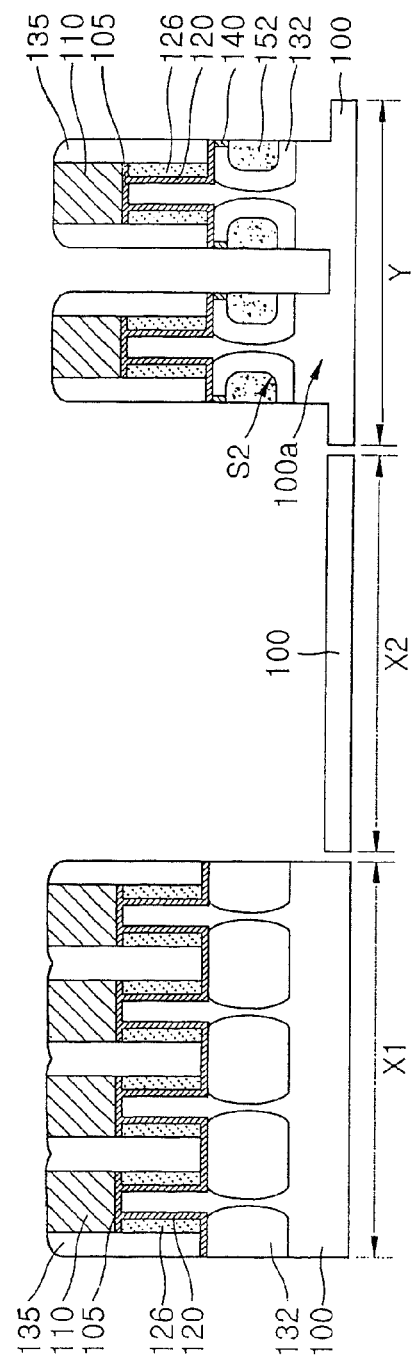

Referring to FIGS. 5D and 6D, using the insulating spacers 135 as an etch mask, the third insulating layer 140 and the semiconductor substrate 100 (i.e, drain region) are anisotropically etched to a predetermined thickness. The semiconductor substrate 100 may be etched to a thickness of 1000-1500 Å so that the drain region 132 remaining may have a thickness of 100-500 Å. At this point, the third insulating layer 140 is extended to a predetermined length on the upper sidewall of the exposed drain region 132.

Thereafter, using the insulating spacer 135 and the third insulating layer 140 as an etch mask, the sidewall of the exposed drain region 132 is isotropically etched to a thickness of about 200-500 Å to form an isotropic space S2 in the drain region 132. The isotropic etching process may be performed by wet etching.

A bit line conductive layer is deposited on the resulting structure of the semiconductor substrate 100 to fill the isotropic space S2. The bit line conductive layer may be formed using a transition metal layer (e.g., a titanium (Ti) layer, tantalum (Ta), a tungsten (W) layer, and/or a cobalt (Co) layer), a transition metal nitride layer (e.g., a titanium nitride (TiN) layer, a tantalum nitride (TaN) layer, and/or a tungsten nitride (WN) layer), and/or a transition metal silicide layer (e.g., a titanium silicide ($TiSi_2$) layer, a tantalum silicide ($TaSi_2$) layer, a tungsten silicide ($WSi_2$) layer, and/or a cobalt silicide ($CoSi_2$) layer). The transition layer and the transition metal nitride layer may be formed by deposition, and the transition metal silicide layer may be formed by deposition or deposition/thermal reaction.

An anisotropic etch-back process is performed on the bit line conductive layer to expose the surface of the hard mask pattern 110 and fill the isotropic space S2, thereby forming a bit line 152. At this point, as the bit line 152 is formed in the isotropic space S2 by etching the drain region 132 to a predetermined thickness, its contact area with the drain region 132 may be increased, which may improve the contact resistance of the bit line 152. Also, the bit line 152 can be insulated from the gate electrode 125 by the third insulating layer 140 formed in the drain region 132.

Thereafter, using the insulating spacer 135 as an etch mask, the exposed semiconductor substrate 100 is etched to a thickness of about 700-1500 Å to separate the drain regions 132, thereby isolating the pillars 100a arranged in a column (or line Y-Y') direction. Thereafter, for complete channel stop, impurity ions (e.g., $BF_2$ ions) may be selectively implanted into the exposed semiconductor substrate 100.

Thereafter, as described above, a process of forming a wordline 160, a process of removing the hard mask pattern 110 to form a source region 170, a process of forming a source contact pad 175 contacting with the source region 170, and a process of forming a storage electrode may be performed.

In the embodiments of FIGS. 5A-5D and 6A-6D, the sidewall of the drain region 132 formed under the pillar 100a is isotropically etched to form a predetermined space, and the bit line 152 is formed in the predetermined space. Consequently, the contact area between the bit line 152 and the drain region 132 can increase, which may improve the contact resistance.

FIGS. 7A through 7D are perspective views illustrating a method of manufacturing a vertical channel semiconductor device according to other embodiments of the present invention. FIGS. 8A through 8D are cross-sectional views further illustrating the above manufacturing method. Specifically, portions "X1", "X2" and "Y" in FIGS. 7A through 7D are sections taken along lines X1-X1', X2-X2' and Y-Y' in FIG. 2, respectively.

Figure 7A:
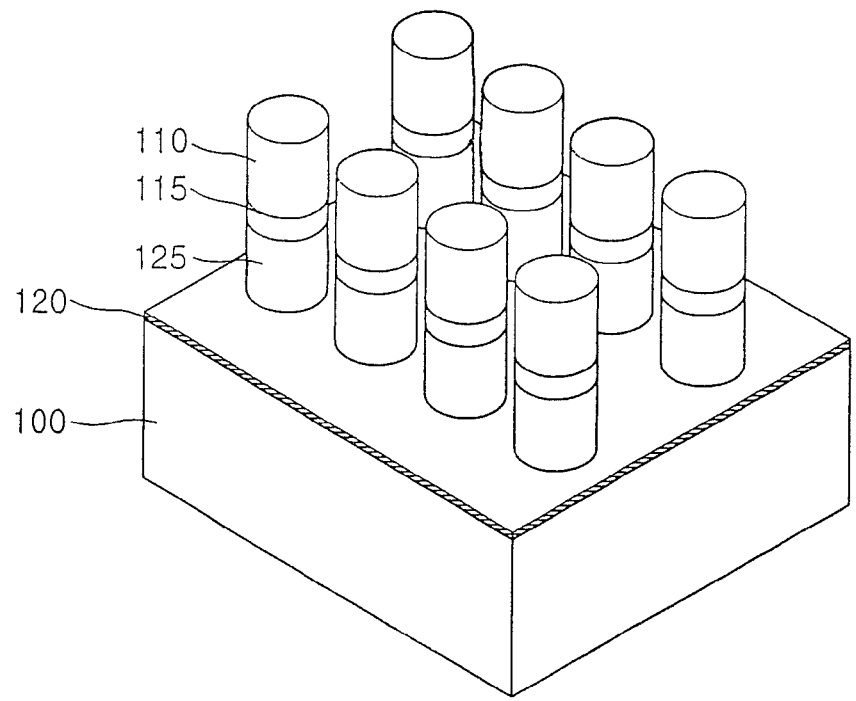
FIGS. 7A through 7D are perspective views illustrating a method of manufacturing a vertical channel semiconductor device according to other embodiments of the present invention.

In substantially the same manner as described previously, the gate electrode 125 may be formed around the pillar 100a at a position spaced apart from the upper surface of the pillar 100a by a predetermined distance (See FIGS. 3A through 3F and 4A through 4F). Thereafter, as illustrated in FIGS. 7A and 8A, junction region impurities (e.g., phosphorus (31P) ions or arsenic (75As) ions) are implanted into the semiconductor substrate 100 covered with the gate insulating layer 120 between the hard mask patterns 110 to form the drain region 132. The junction region impurities may be implanted to a penetration depth Rp of about 800-1200 Å. In some embodiments, the drain region 132 has an actual depth of about 1500-2000 Å.

Figure 7B:
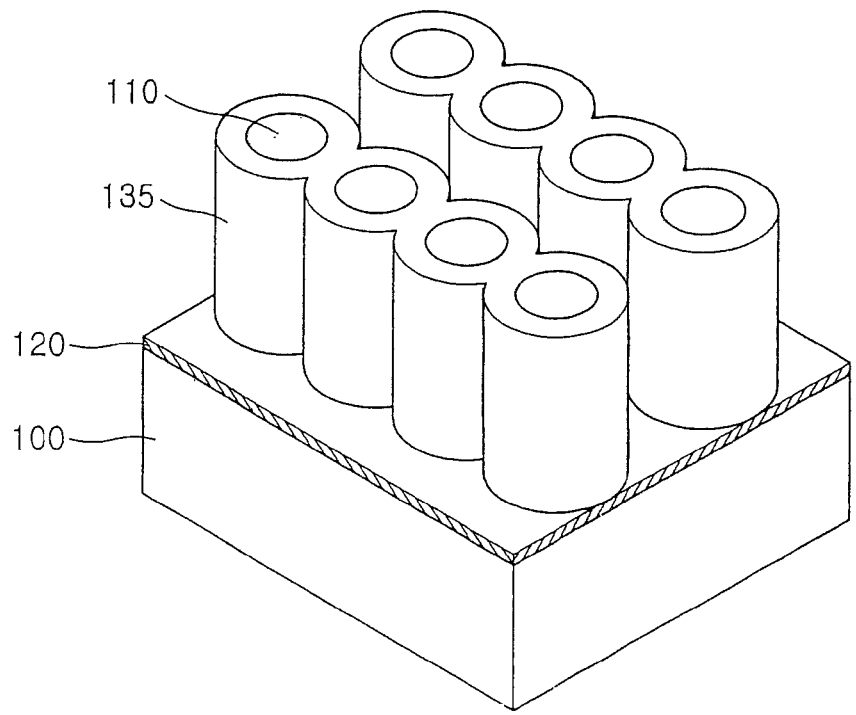

Referring to FIGS. 7B and 8B, using the second insulating layer, an insulating spacer 135 is formed on the sidewall of the hard mask pattern 110. The insulating spacer 135 may be formed to such a thickness as to fill a row (line X1-X1') direction gap between the hard mask patterns 110, as described above.

Figure 7C:
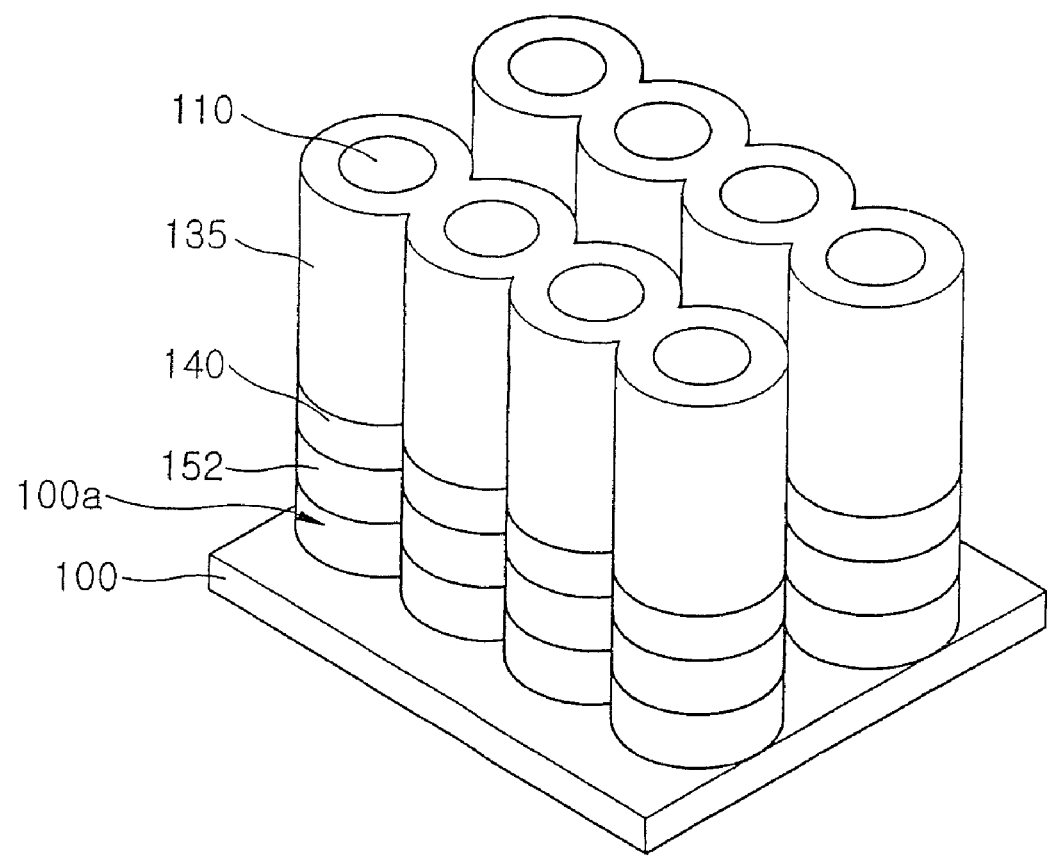
Figure 8C:
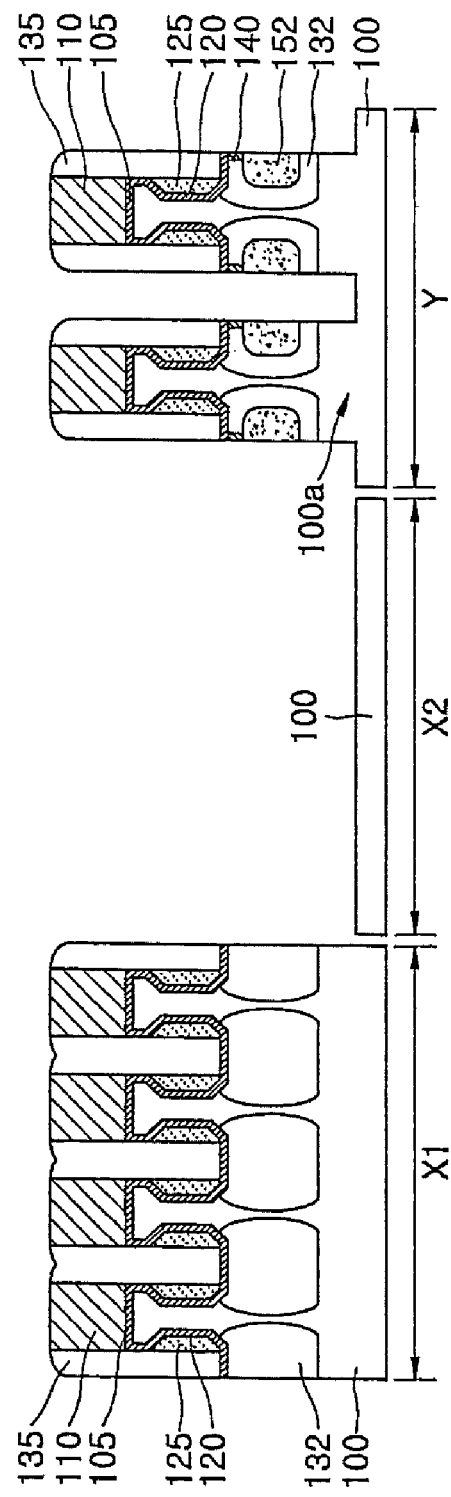

Referring to FIGS. 7C and 8C, using the insulating spacer 135 as an etch mask, the substrate 100 including the exposed drain region 132 is etched to a depth less than the depth of the drain region 132 (i.e., partially etching the drain region 132), for example, 200-300 Å. Consequently, the sidewall of the drain region 132 is exposed to a predetermined length. Thereafter, a third insulating layer 140 is formed on the exposed surface of the drain region 132. The third insulating layer 140 may be an oxide layer formed by thermal oxidation and/or an insulating layer formed by deposition.

Thereafter, using the insulating spacers 135 as an etch mask, the third insulating layer 140 and the semiconductor substrate 100 are anisotropically etched to a thickness of about 1000-1500 Å. Consequently, the third insulating layer 140 with a predetermined thickness remains on the upper sidewall of the drain region 132. Thereafter, using the insulating spacer 135 and the third insulating layer 140 as an etch mask, the sidewall of the exposed drain region 132 is isotropically etched to a thickness of about 200-500 Å to form a second isotropic space S2 in the drain region 132. Thereafter, a bit line conductive layer is deposited on the resulting structure of the semiconductor substrate 100 to fill the second isotropic space S2. Next, an anisotropic etch-back process is performed on the bit line conductive layer to expose the surface of the hard mask pattern 110, thereby forming a bit line 152 in the second isotropic space S2. As the bit line 152 is formed in the second isotropic space S2 of the drain region 132, its contact area with the drain region 132 increases, which may improve the contact resistance of the bit line 152.

Thereafter, using the insulating spacer 135 as an etch mask, the exposed semiconductor substrate 100 is etched to a depth of about 700-1500 Å to separate the drain regions 132, thereby isolating the pillars 100a arranged in a column (or line Y-Y') direction. Thereafter, for improved channel stop characteristics, impurity ions (e.g., $BF_2$ ions) may be selectively implanted into the exposed semiconductor substrate 100.

Figure 7D:
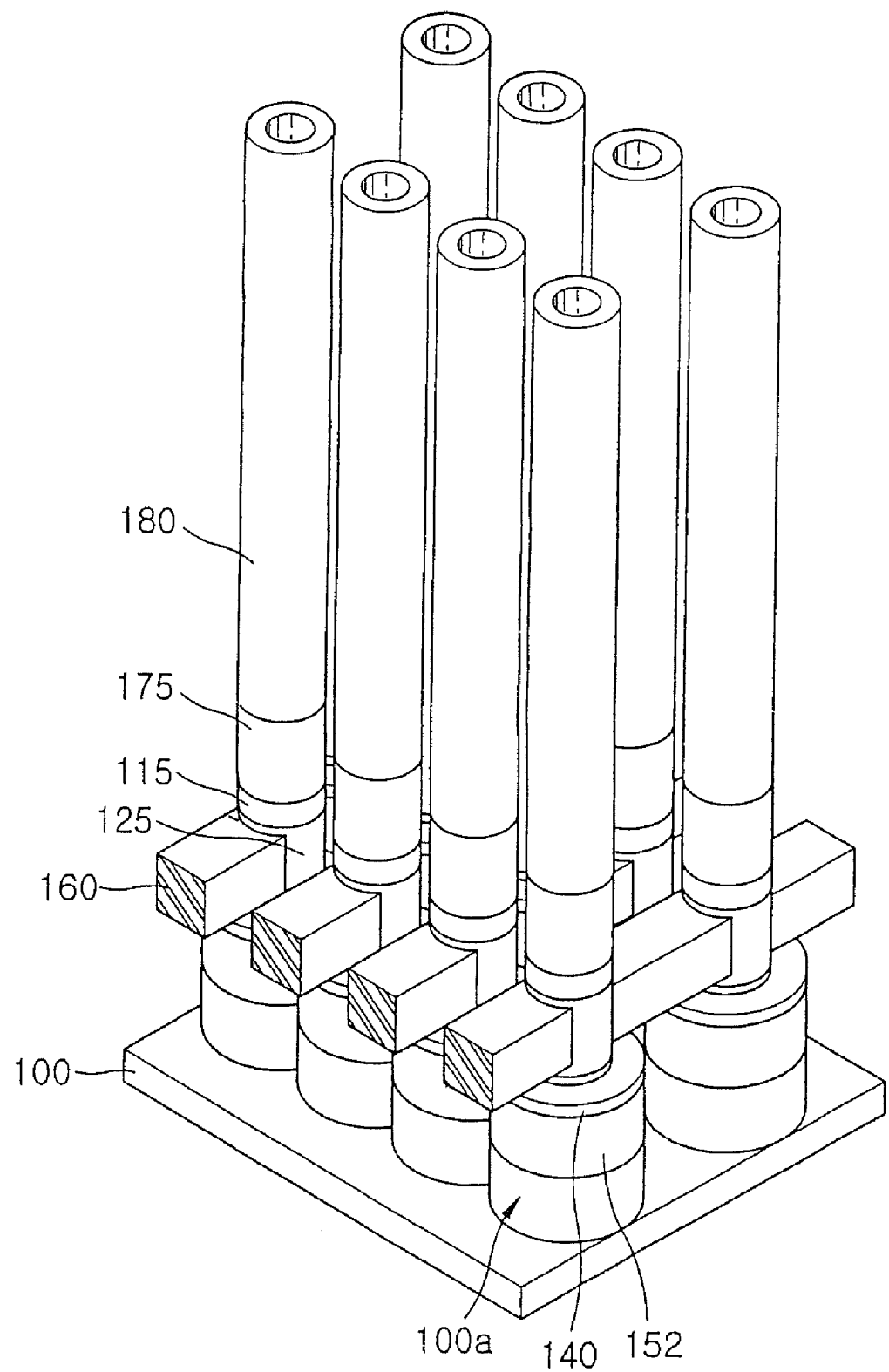
Figure 8D:
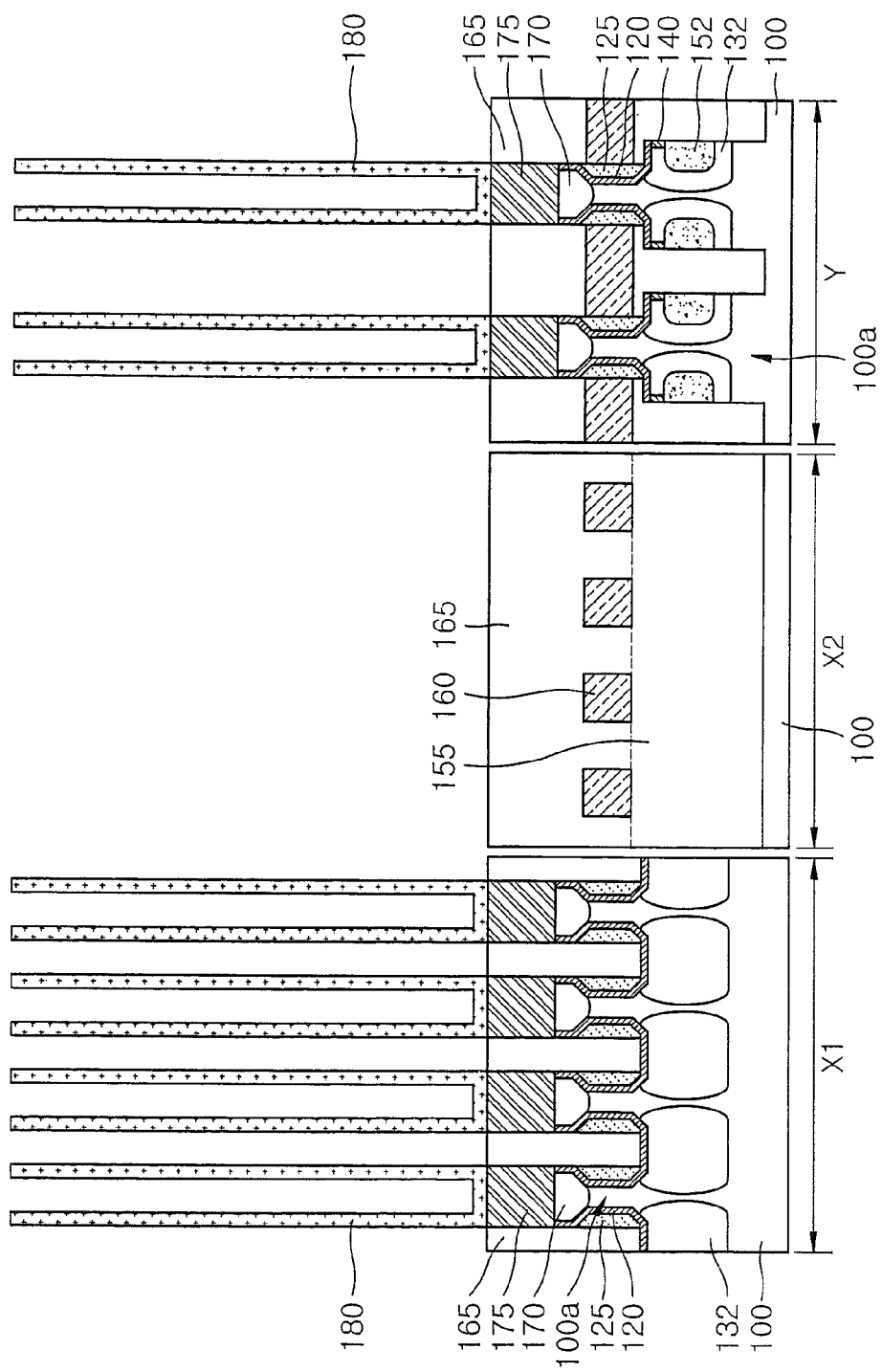

Referring to FIGS. 7D and 8D, a first interlayer insulating layer 155, which is planarized to have the same height as the hard mask pattern 110, is formed on the resulting structure of the semiconductor substrate 100. Thereafter, a wordline intended region (not illustrated) perpendicular to the bit line 152 is formed to expose the gate electrode 125 at the edge of the pillar 100a.

A wordline conductive layer is filled into the wordline intended region and is then etched to a predetermined thickness, such that it has a thickness of about 500-1500 Å, thereby forming a wordline 160. The wordline 160 electrically contacts the gate electrode 125 and extends perpendicular to the bit line 152. A second interlayer insulating layer 165 is deposited on the resulting structure of the semiconductor substrate 100 to a thickness of about 100-1500 Å, and is then planarized to expose the hard mask pattern 110. The exposed hard mask pattern 110 is removed along with the underlying pad oxide layer 105.

Junction region impurities (e.g., phosphorus ions or arsenic ions) are implanted into the surface of the pillar 100a to form the source region 170. At this point, the source region 170 and the drain region 132 are located above and below the gate electrode 125 to form a channel perpendicular to the surface of the semiconductor substrate 100. A source contact pad 175 is formed in the space between the second interlayer insulating layers 165 (i.e., the region from which the hard mask pattern 110 has been removed) to contact the source region 170. As the gate electrode 125 is formed around the periphery of the pillar 100a at a position spaced apart from the upper surface of the pillar 100a by a predetermined distance, the entire upper surface of the pillar 100a is provided as the source region 170. In addition, the sidewall of the pillar 100a above the gate electrode 125 serves as the source region 170 and is covered with the insulating layer 115. Therefore, the contact pad 175 contacting the entire area of the source region 170 can be formed without providing a spacer for insulating it from the gate electrode 125. Consequently, it may be possible to improve the contact resistance between the source region 170 and the source contact pad 175. A cylindrical storage electrode 180 is shown formed on the source contact pad 175.

Figure 9:
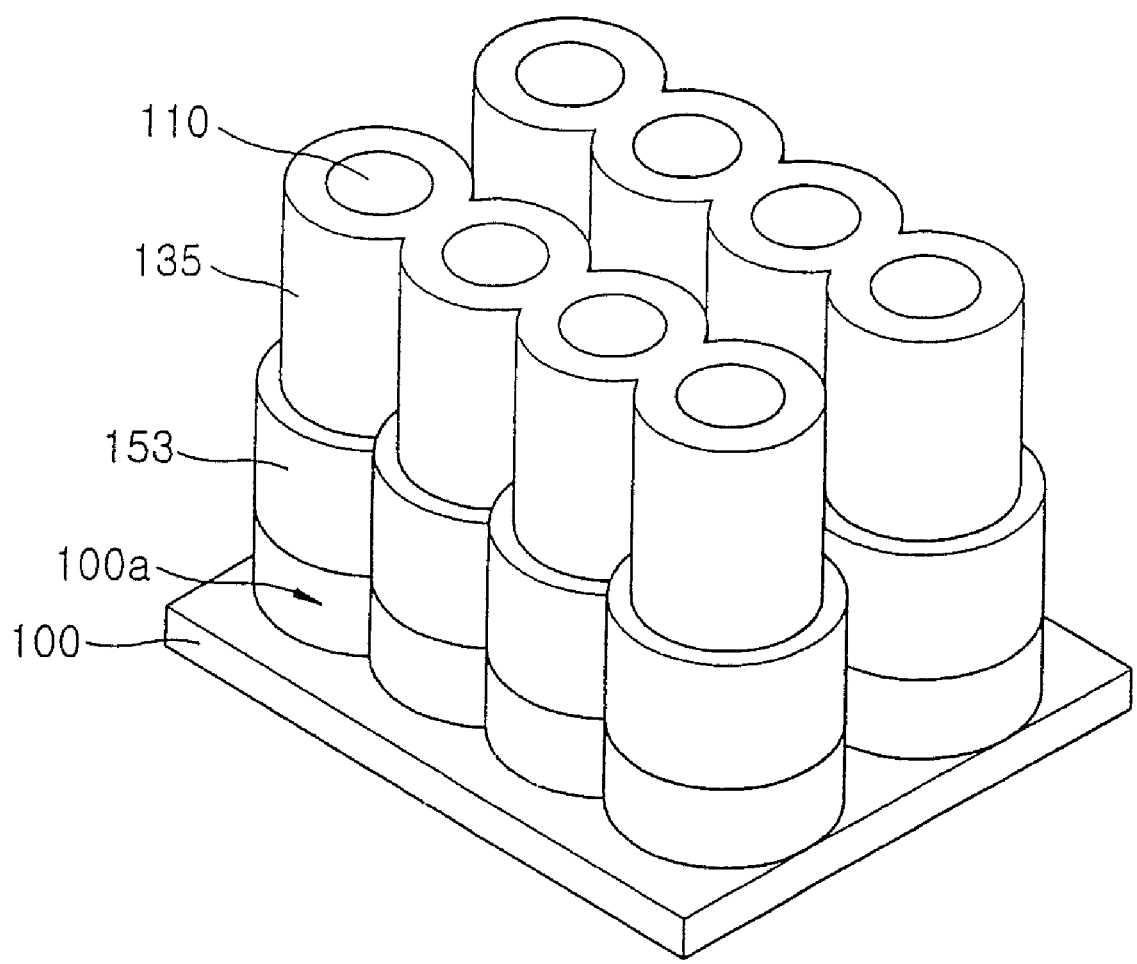
FIG. 9 is a perspective view of a vertical channel semiconductor device according to some embodiments of the present invention.
Figure 10:
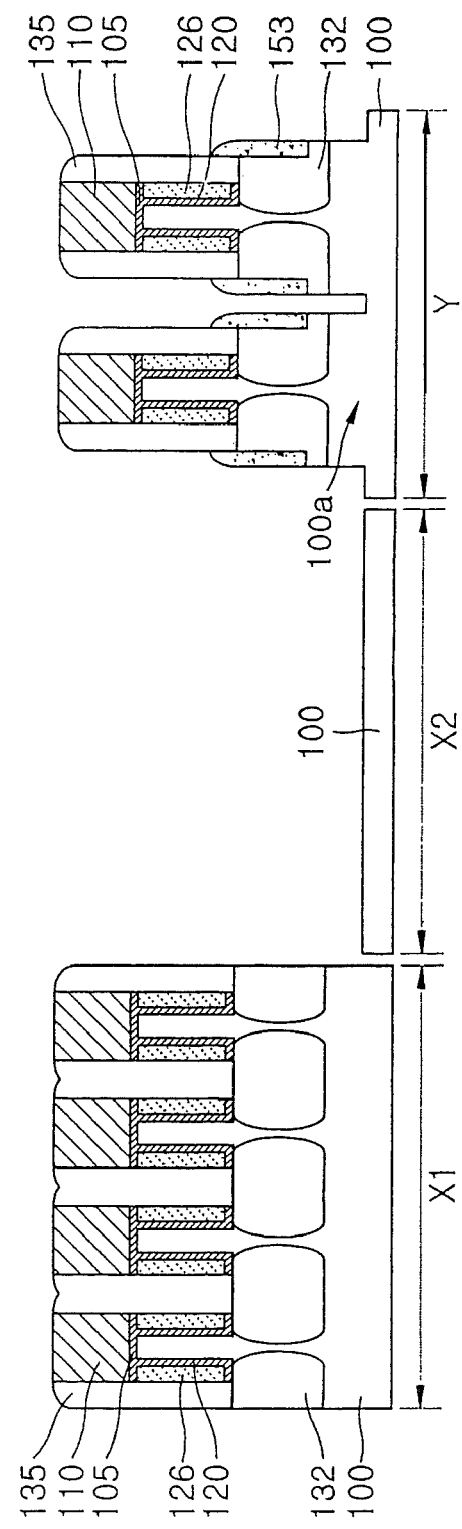
FIG. 10 is a cross-sectional view of a vertical channel semiconductor device according to some embodiment of the present invention, with regions "X1", "X2" and "Y" in FIG. 10 being sections taken along lines X1-X1', X2-X2' and Y-Y' in FIG. 2, respectively.

FIG. 9 is a perspective view of a vertical channel semiconductor device according to further embodiments of the present invention. FIG. 10 is a cross-sectional view of the vertical channel semiconductor device of FIG. 9. Specifically, portions "X1", "X2" and "Y" in FIG. 10 are sections taken along lines X1-X1', X2-X2' and Y-Y' in FIG. 2, respectively.

Referring to FIGS. 9 and 10, the drain region 132 and the insulating spacers 135 may be formed in the same manner as described previously. Thereafter, using the insulating spacers 135 as an etch mask, the drain region 132 is anisotropically etched to a thickness of, for example, about 1000-1500 Å.

A bit line conductive layer is deposited on the resulting substrate 100, and an anisotropic etch-back process is performed on the bit line conductive layer to form a space-shaped bit line 153 on the sidewall of the drain region 132. Using the bit line 153 as an etch mask, the semiconductor substrate 100 is etched to isolate pillars 100a.

Even when the spacer-shaped bit line 153 is formed on the sidewall of the drain region 132, the contact area between the spacer-shaped bit line 153 and the drain region 132 may increase and may improve (or reduce) the contact resistance.

In the above embodiments, the junction regions 130 and 132 formed below the gate electrodes 125 and 126 to contact with the bit line 150 have been referred to as the drain region, and the junction regions 170 formed above the gate electrodes 125 and 126 to contact with the contact pad 175 have been referred to as the source region. However, it should be noted that the junction region contacting the bit line 150 can be the source region and the junction region contacting the contact pad 175 can be the drain region.

Also, as a DRAM memory device has been illustrated for explanatory purposes, a line for transmitting signals to the gate electrodes 125 and 126 has been referred to as a wordline, and a line for transmitting signals to the drain regions 130 and 132 has been referred to as a bit line. It will be apparent to those skilled in the art that the wordline and the bit line may more generally be referred to as a gate signal line and a source/drain signal line, respectively. In addition, although the structure obtained by etching a predetermined portion of the semiconductor substrate has been referred to as a pillar, it can also be referred to as a protrusion or a silicon pattern.

Some embodiments of the present invention provide a vertical channel semiconductor device that has an improved contact resistance and, thus, can provide improved electrical characteristics. Some embodiments provide a vertical channel semiconductor device that has an improved bit line contact resistance together with a sufficient source contact pad area and, thus, can provide an improved contact resistance. Method of manufacturing such vertical channel semiconductor devices are also provided.

According to some embodiments, a gate electrode surrounding a pillar is formed spaced apart from the surface of the pillar by a predetermined distance, and a second source/drain region is formed on the entire surface of the pillar. Accordingly, the area of the second source/drain region can be increased. Also, the contact pad contacting with the second source/drain region can be formed to such a size as to contact with the entire surface of the source region, without the need of the insulating spacer for insulating it from the gate electrode. Consequently, it may be possible to improve (or reduce) the contact resistance.

Also, in some embodiments, the isotropic space is provided on the sidewall of the drain region, and the bit line is formed in the isotropic space. Accordingly, the contact area between the first source/drain region and the bit line can be increased. Consequently, it may be possible to improve the contact resistance.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a vertical channel semiconductor device, the method comprising:
   forming a pillar having a vertical depth on a semiconductor substrate;
   forming a gate electrode around a periphery of the pillar;
   forming a first source/drain region on the semiconductor substrate below the gate electrode;
   etching the first source/drain region to a predetermined depth to expose a sidewall of the first source/drain region;
   forming an isotropic space on the sidewall of the first source/drain region vertically spaced apart from an upper surface of the first source/drain region by a predetermined distance;
   filling the isotropic space with a conductive layer to form a first source/drain signal line; and
   forming a second source/drain region on an exposed upper surface of the pillar.

2. The method of claim 1, wherein forming the pillar comprises:
   forming a pad oxide layer and a hard mask pattern on the semiconductor substrate;
   forming the pillar by etching the pad oxide layer and the semiconductor substrate to a predetermined depth in the shape of the hard mask pattern; and
   wherein forming the second source/drain region is preceded by:
   separating the first source/drain region from adjacent source/drain regions; and
   removing the hard mask pattern.

3. The method of claim 2, wherein forming the pillar comprises:
   etching the semiconductor substrate to a first depth using the hard mask pattern as an etch mask;
   selectively forming an insulating layer on the sidewall of the etched semiconductor substrate; and
   further etching the semiconductor substrate to a second depth using the hard mask pattern and the insulating layer as an etch mask.

4. The method of claim 3, wherein forming the gate electrode comprises:
   isotropically etching the pillar using the hard mask pattern and the insulating layer as an etch mask to form an isotropic space;
   forming a gate insulating layer on the surface of the pillar including the isotropic space; and
   filling the isotropic space with a conductive layer.

5. The method of claim 2, wherein forming the gate electrode comprises:
   anisotropically etching the pillar to a predetermined width using the hard mask pattern as an etch mask; and
   covering the periphery of the pillar with a conductive layer.

6. The method of claim 2, further comprising forming a gate signal line contacting the gate electrode after forming the first source/drain signal line and before removing the hard mask pattern.

7. The method of claim 6, wherein forming the gate signal line comprises:
   depositing a first interlayer insulating layer on the semiconductor substrate including the first source/drain signal line;
   etching a predetermined portion of the first interlayer insulating layer to form a line groove that is perpendicular to the first source/drain signal line and exposes the gate electrode of the sidewall of the pillar;
   filling the line groove with an conductive layer contacting the gate electrode;
   etching back the conductive layer to a predetermined thickness; and then
   filling the line groove with a second interlayer insulating layer.

8. The method of claim 2, further comprising, after forming the second source/drain region:
   depositing a conductive layer on the second interlayer insulating layer to fill a space from which the hard mask pattern is removed;
   planarizing the conductive layer to form a contact pad; and
   forming a storage electrode on the contact pad.

9. A method of manufacturing a vertical channel semiconductor device, the method comprising:
   forming a pad oxide layer and a hard mask pattern on a semiconductor substrate;
   forming pillars by etching the pad oxide layer and the semiconductor substrate to a predetermined depth in the shape of the hard mask pattern;
   forming a first isotropic space at a position spaced apart from the upper surface of the pillar;
   forming a gate insulating layer on the surface of the pillar including the first isotropic space;
   filling the first isotropic space of the pillar with a conductive material to form a gate electrode disposed at a position spaced apart from the upper surface of the pillar by a predetermined distance to surround the pillar;
   forming a first source/drain region on the semiconductor substrate below the gate electrode;
   etching the first source/drain region to a predetermined depth;
   forming a second isotropic space on the sidewall of the first source/drain region spaced apart from the upper surface of the first source/drain region by a predetermined distance;

filling the second isotropic space with a conductive layer to form a first source/drain signal line;
separating the first source/drain region;
forming a gate signal line contacting with the gate electrode;
removing the hard mask pattern; and
forming a contact pad contacting with a second source/drain region.

10. The method of claim 9, wherein the forming of the pillar includes:
etching the semiconductor substrate to a first depth using the hard mask pattern as an etch mask;
selectively forming an insulating layer on the sidewall of the etched semiconductor substrate; and
further etching the semiconductor substrate to a second depth using the hard mask pattern and the insulating layer as an etch mask.

11. The method of claim 9, wherein the forming of the gate signal line includes:
depositing a first interlayer insulating layer on the resulting structure of the semiconductor substrate on which the first source/drain signal line is formed;
etching a predetermined portion of the first interlayer insulating layer to form a line groove that is perpendicular to the first source/drain signal line and exposes the gate electrode of the pillar;
filling the line groove with an conductive layer contacting with the gate electrode;
etch-backing the conductive layer to a predetermined thickness; and
filling the line groove with a second interlayer insulating layer.

12. The method of claim 11, wherein the forming of the contact pad includes:
depositing a conductive layer on the second interlayer insulating layer to fill a space from which the hard mask pattern is removed; and
planarizing the conductive layer.

13. The method of claim 9, further comprising forming a storage electrode on the contact pad after the forming of the contact pad.

* * * * *